US012567718B2

(12) United States Patent
Kaji et al.

(10) Patent No.: US 12,567,718 B2
(45) Date of Patent: Mar. 3, 2026

(54) SEMICONDUCTOR LASER DRIVING APPARATUS, ELECTRONIC EQUIPMENT, AND MANUFACTURING METHOD OF SEMICONDUCTOR LASER DRIVING APPARATUS

(71) Applicant: SONY SEMICONDUCTOR SOLUTIONS CORPORATION, Kanagawa (JP)

(72) Inventors: Nobuaki Kaji, Kanagawa (JP); Hirohisa Yasukawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 941 days.

(21) Appl. No.: 17/641,281

(22) PCT Filed: Jul. 20, 2020

(86) PCT No.: PCT/JP2020/028019
§ 371 (c)(1),
(2) Date: Mar. 8, 2022

(87) PCT Pub. No.: WO2021/053961
PCT Pub. Date: Mar. 25, 2021

(65) Prior Publication Data
US 2022/0294181 A1 Sep. 15, 2022

(30) Foreign Application Priority Data
Sep. 18, 2019 (JP) .................................. 2019-168924

(51) Int. Cl.
*H01S 5/02253* (2021.01)
*H01S 5/026* (2006.01)

(52) U.S. Cl.
CPC ........ *H01S 5/02253* (2021.01); *H01S 5/0261* (2013.01)

(58) Field of Classification Search
CPC ..... H01S 5/0235–0237; H01S 5/02253; H01S 5/02255; H01S 5/0225–02257;
(Continued)

(56) References Cited

U.S. PATENT DOCUMENTS 7,164,702 B1 1/2007 Liu et al.
8,434,910 B2* 5/2013 Kim ..................... H10H 20/855
362/268
(Continued)

FOREIGN PATENT DOCUMENTS

CN 1497805 A 5/2004
CN 109378703 A 2/2019
(Continued)

OTHER PUBLICATIONS

International Search Report prepared by the Japan Patent Office on Oct. 5, 2020, for International Application No. PCT/JP2020/028019, 3 pgs.

*Primary Examiner* — Minsun O Harvey
*Assistant Examiner* — Fernanda Adriana Camacho Alanis
(74) *Attorney, Agent, or Firm* — Sheridan Ross PC

(57) ABSTRACT

To reduce the wiring inductance between a semiconductor laser and a laser driver in a semiconductor laser driving apparatus. A substrate incorporates a laser driver. A semiconductor laser is mounted on one surface of the substrate of a semiconductor laser driving apparatus to emit irradiation light from an irradiation surface. Connection wiring electrically connects the laser driver and the semiconductor laser to each other with a wiring inductance of 0.5 nanohenries or less. A first optical element is provided on the irradiation surface side of the semiconductor laser. A second optical element is provided outside the first optical element on the irradiation surface side of the semiconductor laser.

11 Claims, 21 Drawing Sheets

(58) Field of Classification Search
CPC  H01S 5/40–426; G02B 27/0955–0966; G02B
27/0977–0983
See application file for complete search history.

(56)                    References Cited

U.S. PATENT DOCUMENTS

|  |  |  |  |  |
|---|---|---|---|---|
| 8,888,331 | B2 | 11/2014 | Mandelboum | |
| 9,740,042 | B2 * | 8/2017 | Nam | G02F 1/133526 |
| 9,825,425 | B2 | 11/2017 | Mor | |
| 11,415,284 | B2 * | 8/2022 | Park | F21S 41/148 |
| 2005/0067698 | A1 | 3/2005 | Aruga | |
| 2011/0163334 | A1 * | 7/2011 | Krijn | F21V 7/043 |
| | | | | 257/E33.061 |
| 2014/0327902 | A1 | 11/2014 | Giger | |
| 2015/0229912 | A1 | 8/2015 | Masalkar et al. | |
| 2017/0102508 | A1 | 4/2017 | Yoda et al. | |
| 2018/0278011 | A1 * | 9/2018 | Galvano | G01S 7/4813 |
| 2019/0196201 | A1 * | 6/2019 | Pierer | H01S 5/4093 |
| 2022/0114835 | A1 * | 4/2022 | Minamiru | G06V 40/166 |

FOREIGN PATENT DOCUMENTS

| | | | |
|---|---|---|---|
| JP | H11273138 | A | 10/1999 |
| JP | 2002-232062 | | 8/2002 |
| JP | 2004247458 | A | 9/2004 |
| JP | 2005268443 | A | 9/2005 |
| JP | 2007318075 | A | 12/2007 |
| JP | 2009-170675 | | 7/2009 |
| JP | 2017-163371 | | 9/2017 |
| WO | WO 2015/146377 | | 10/2015 |
| WO | WO-2018188910 | A1 | 10/2018 |
| WO | WO 2019/041274 | | 3/2019 |

* cited by examiner

F I G . 1
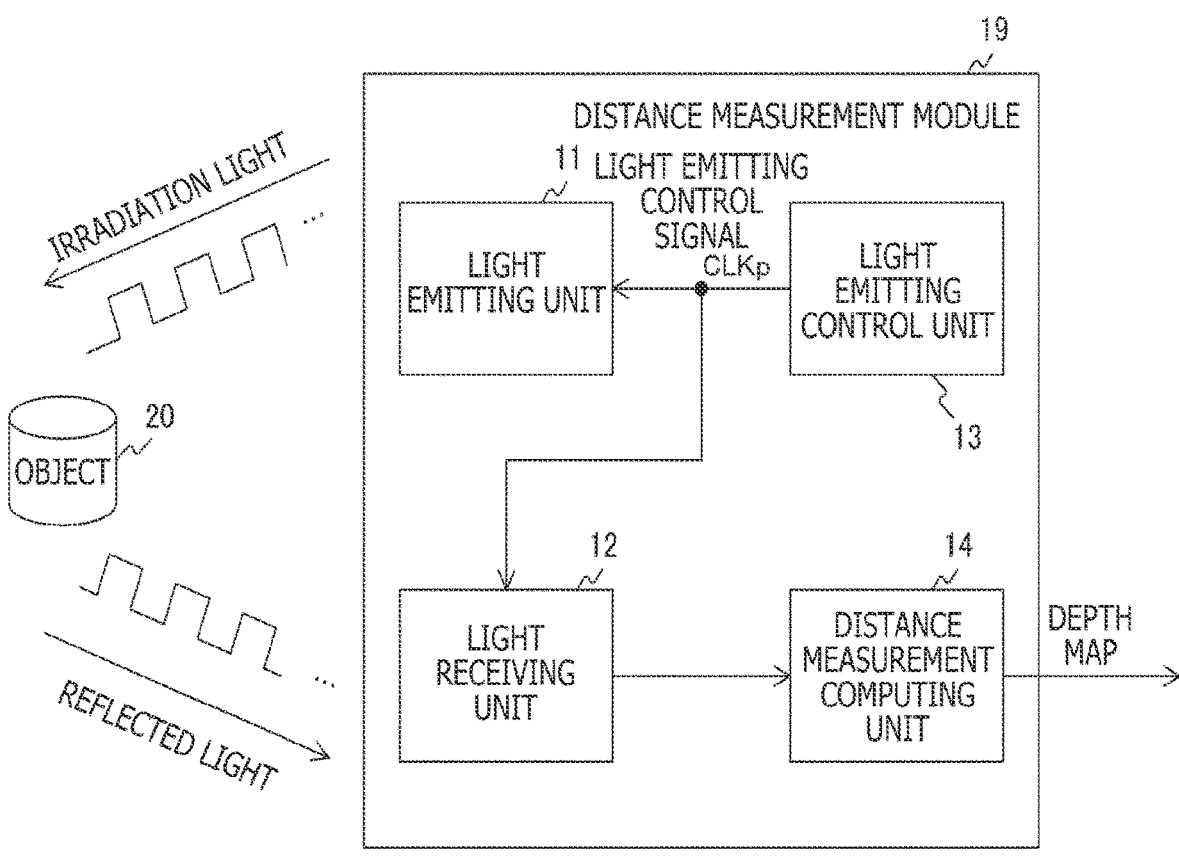

F I G . 2
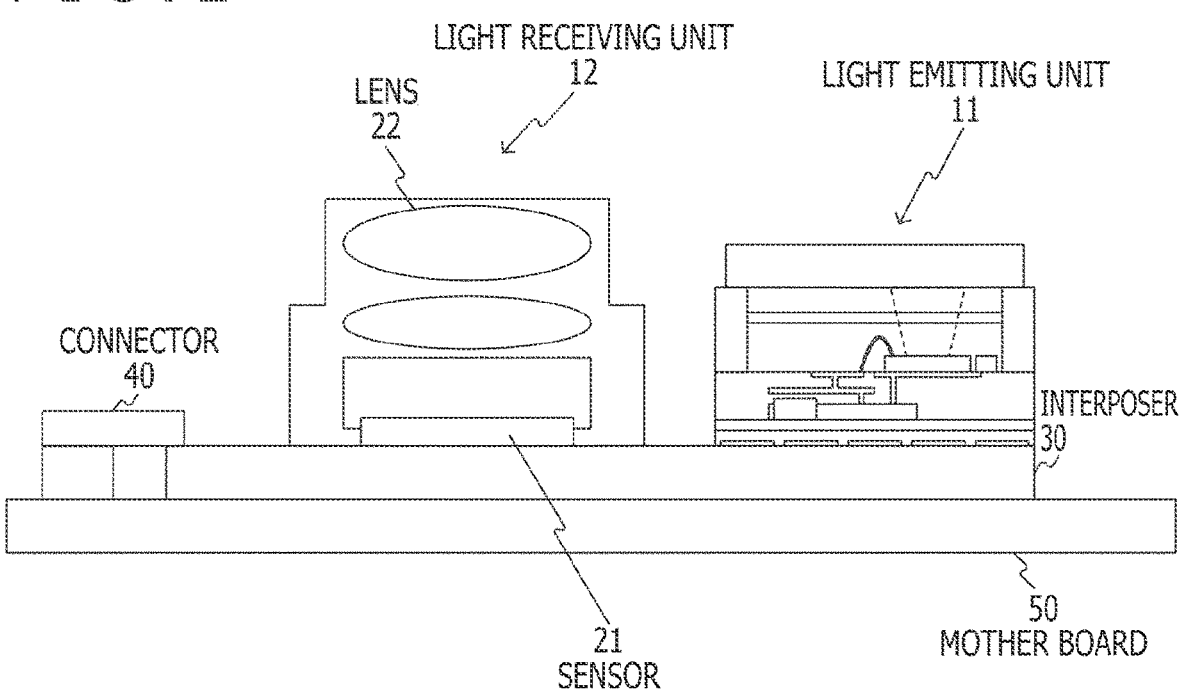
LIGHT RECEIVING UNIT
12
LENS
22
LIGHT EMITTING UNIT
11
CONNECTOR
40
INTERPOSER
30
21
SENSOR
50
MOTHER BOARD

F I G . 3
LIGHT EMITTING UNIT 11
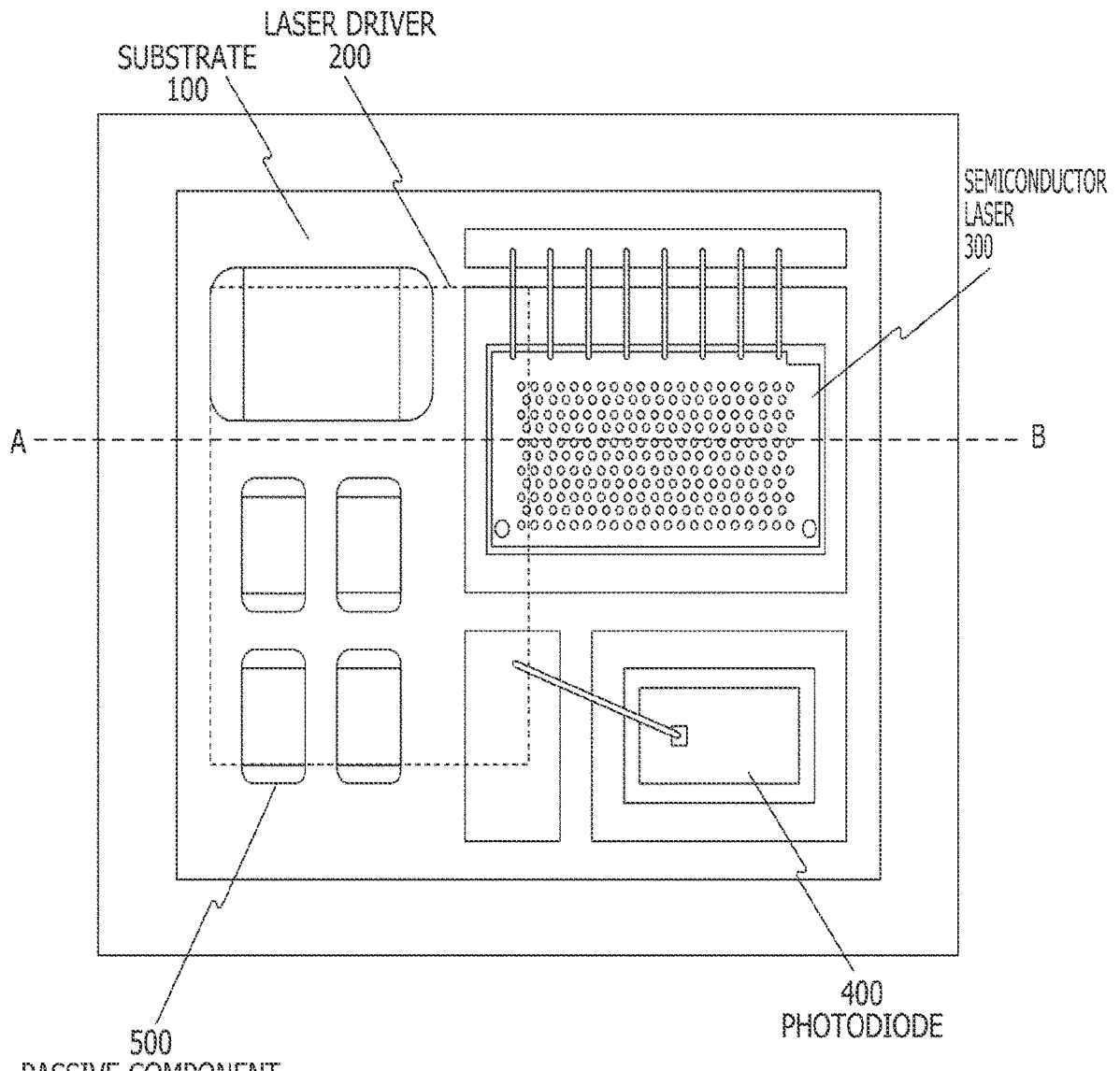
SUBSTRATE
100
LASER DRIVER
200
SEMICONDUCTOR
LASER
300
A
B
400
PHOTODIODE
500
PASSIVE COMPONENT

COLLIMATOR LENS
610

DIFFRACTIVE OPTICAL ELEMENT
710

FRAME
600

SUBSTRATE
100

200
LASER DRIVER

101
CONNECTION VIA

300
SEMICONDUCTOR
LASER

F I G . 6
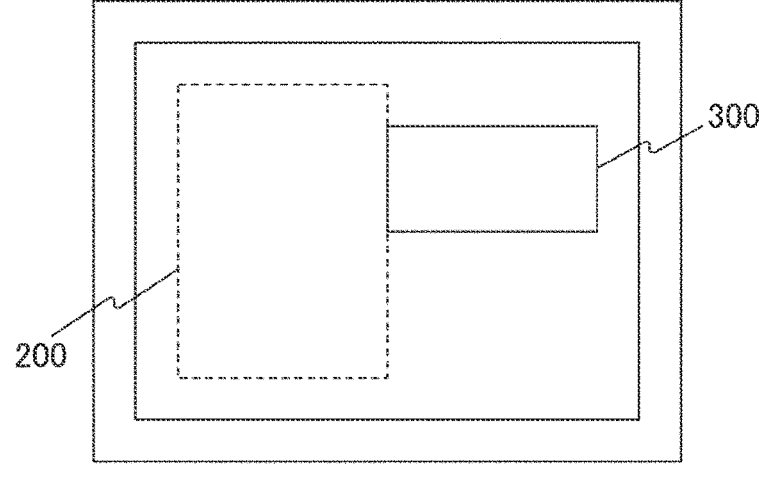
<u>a</u>     OVERLAP: 0%
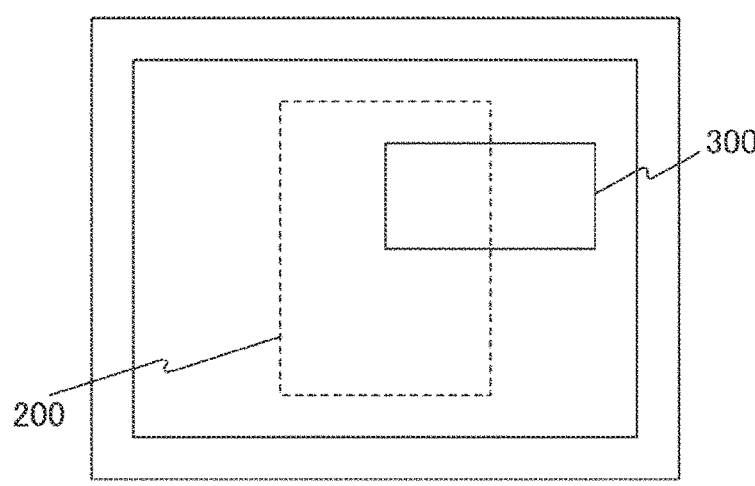
<u>b</u>     OVERLAP: 50%
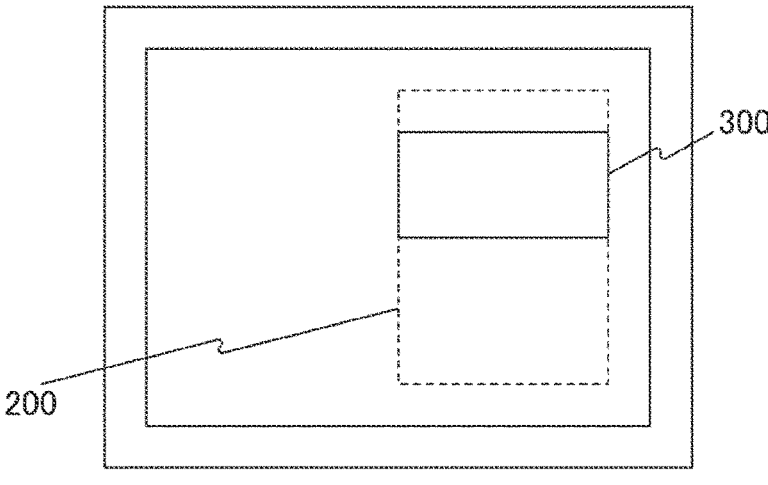
<u>c</u>     OVERLAP: 100%

FIG.7

ADDITIVE METHOD (H=15μm)

| | | L | | | | |
|---|---|---|---|---|---|---|
| | | 0.3mm | 0.5mm | 1mm | 2mm | 3mm |
| W | 0.015mm | 0.21 | 0.40 | 0.94 | 2.16 | 3.48 |
| | 0.05mm | 0.16 | 0.33 | 0.79 | 1.85 | 3.02 |
| | 0.1mm | 0.13 | 0.27 | 0.68 | 1.63 | 2.69 |
| | 0.2mm | 0.09 | 0.21 | 0.56 | 1.39 | 2.33 |
| | 0.3mm | 0.07 | 0.17 | 0.48 | 1.24 | 2.11 |

FIG.8

SUBTRACTIVE METHOD (H=35μm)

| | | L | | | | |
|---|---|---|---|---|---|---|
| | | 0. 3mm | 0. 5mm | 1mm | 2mm | 3mm |
| W | 0. 035mm | 0. 16 | 0. 32 | 0. 77 | 1. 82 | 2. 98 |
| | 0. 05mm | 0. 15 | 0. 30 | 0. 73 | 1. 75 | 2. 86 |
| | 0. 1mm | 0. 12 | 0. 25 | 0. 65 | 1. 57 | 2. 59 |
| | 0. 2mm | 0. 09 | 0. 20 | 0. 54 | 1. 35 | 2. 27 |
| | 0. 3mm | 0. 07 | 0. 17 | 0. 47 | 1. 22 | 2. 07 |

F I G . 9
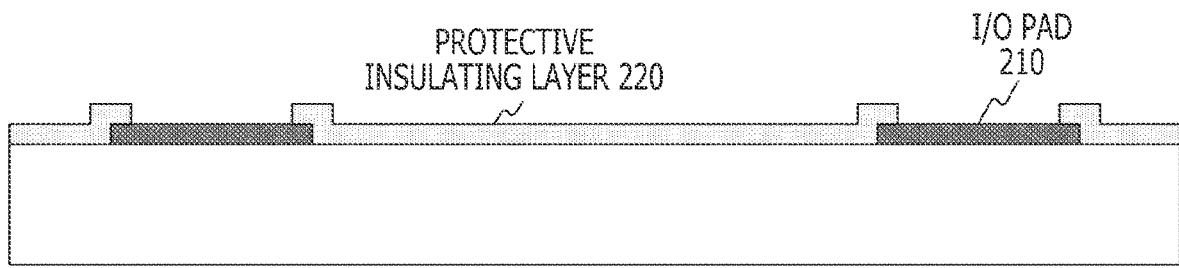
a
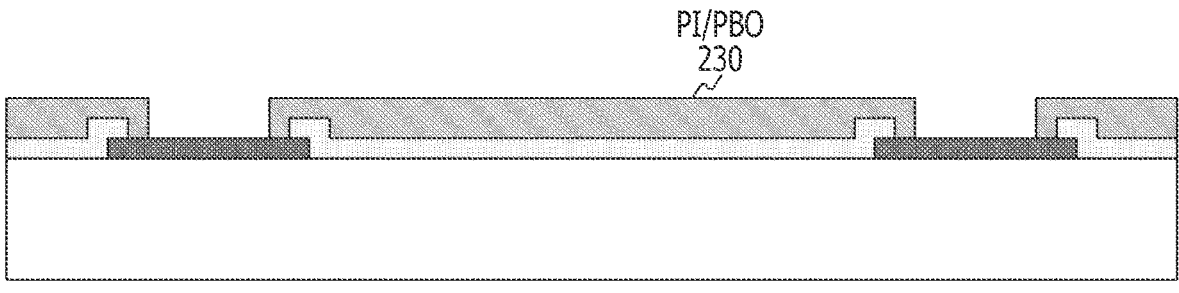
b
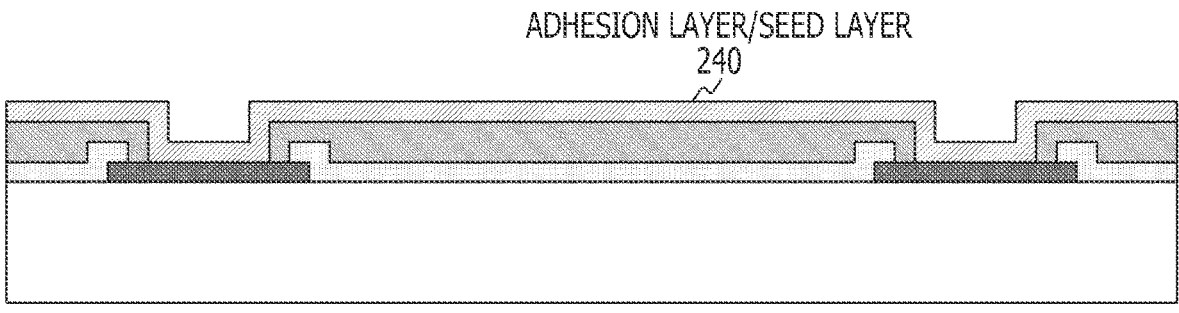
c

PHOTORESIST
250 d

COPPER LAND/COPPER
REDISTRIBUTION
LAYER (RDL) 260 e f

FIG. 11

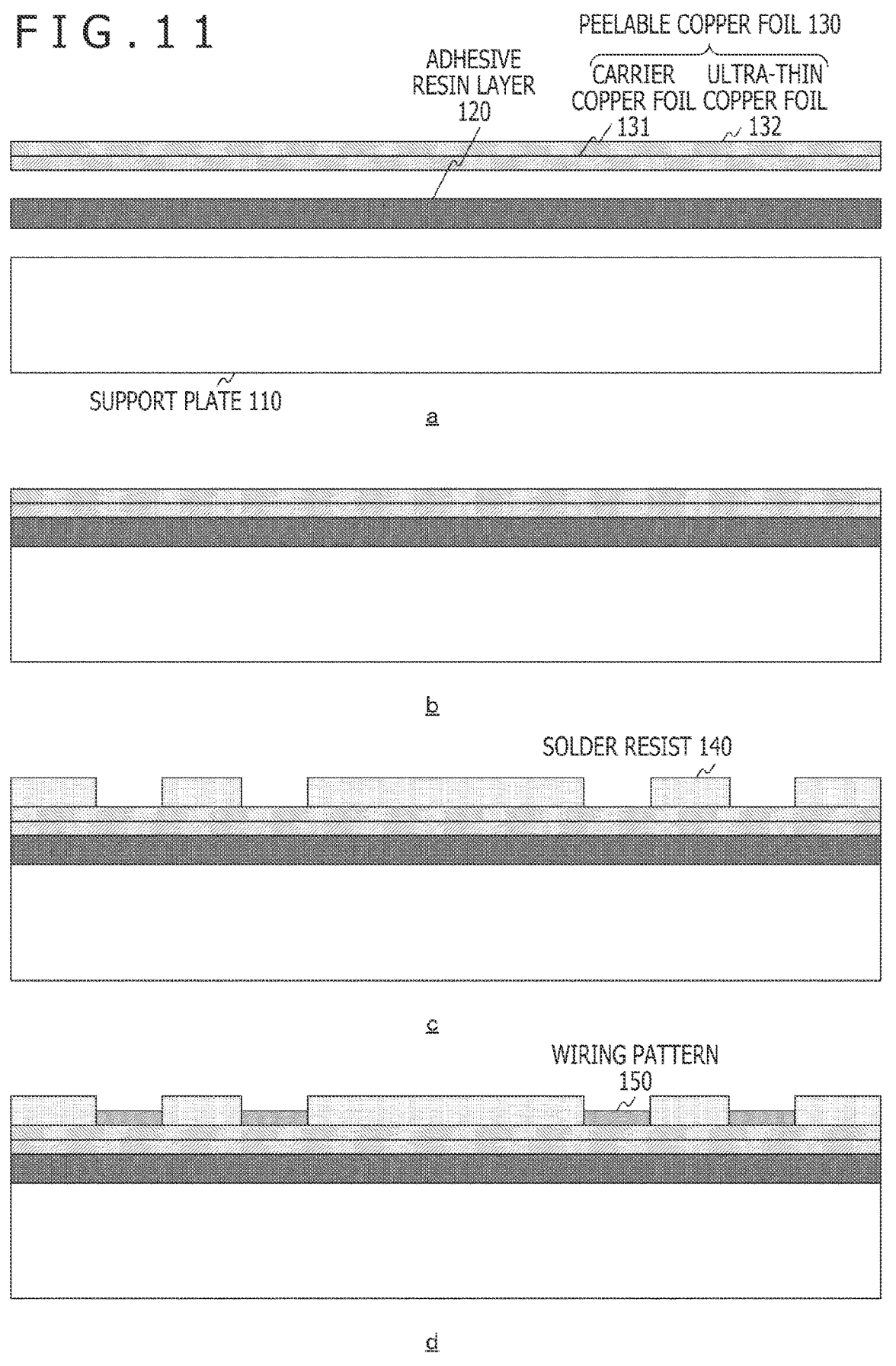

ADHESIVE
RESIN LAYER
120

PEELABLE COPPER FOIL 130

CARRIER
COPPER FOIL
131

ULTRA-THIN
COPPER FOIL
132

SUPPORT PLATE 110 a b

SOLDER RESIST 140 c

WIRING PATTERN
150 d e

INTERLAYER
INSULATING RESIN
161 f

VIA HOLE 170 g

INTERLAYER
INSULATING RESIN
162 h i i k l m n

Q

SOLDER RESIST
180

180
SOLDER RESIST

R a b

ELECTRONIC EQUIPMENT
800

DISPLAY UNIT
880

POWER BUTTON
840

IMAGING UNIT
810

DISTANCE
MEASUREMENT MODULE
820

HOUSING
801

830
SHUTTER BUTTON

881

882

1.5m          0.3m

SEMICONDUCTOR LASER DRIVING APPARATUS, ELECTRONIC EQUIPMENT, AND MANUFACTURING METHOD OF SEMICONDUCTOR LASER DRIVING APPARATUS

CROSS REFERENCE TO RELATED APPLICATIONS

This application is a national stage application under 35 U.S.C. 371 and claims the benefit of PCT Application No. PCT/JP2020/028019, having an international filing date of 20 Jul. 2020, which designated the United States, which PCT application claimed the benefit of Japanese Patent Application No. 2019-168924, filed 18 Sep. 2019, the entire disclosures of each of which are incorporated herein by reference.

TECHNICAL FIELD

The present technique relates to a semiconductor laser driving apparatus. Specifically, the present technique relates to a semiconductor laser driving apparatus and electronic equipment including a substrate incorporating a laser driver and a semiconductor laser and a manufacturing method of the semiconductor laser driving apparatus.

BACKGROUND ART

In an electronic apparatus having a distance measurement function, a distance measurement system called ToF (Time of Flight) has often been used from the past. ToF is a system in which a light emitting unit irradiates an object with irradiation light of a sine wave or a rectangular wave, a light receiving unit receives the reflected light from the object, and a distance measurement computing unit measures a distance on the basis of a phase difference between the irradiation light and the reflected light. In order to realize such a distance measurement function, there is known an optical module in which a light emitting element and an electronic semiconductor chip for driving the light emitting element are housed in a case and integrated. For example, an optical module that includes a laser diode array mounted in alignment on an electrode pattern of a substrate and a driver IC electrically connected to the laser diode array has been proposed (refer to, for example, PTL 1).

CITATION LIST

Patent Literature

[PTL 1]
Japanese Patent Laid-open No. 2009-170675

SUMMARY

Technical Problem

In the related art described above, the laser diode array and the driver IC are integrated and configured as an optical module. However, in the related art, the laser diode array and the driver IC are electrically connected to each other by a plurality of wires, the wiring inductance therebetween becomes large, and there is a risk that the drive waveform of the semiconductor laser is distorted. This is particularly problematic for ToF driven at hundreds of megahertz.

The present technique has been developed in view of such a situation, and an object thereof is to reduce a wiring inductance between a semiconductor laser and a laser driver in a semiconductor laser driving apparatus.

Solution to Problem

The present technique has been made in order to solve the above-described problem, and a first aspect thereof is to provide a semiconductor laser driving apparatus and electronic equipment including the semiconductor laser driving apparatus, the semiconductor laser driving apparatus including a substrate incorporating a laser driver, a semiconductor laser mounted on one surface of the substrate to emit irradiation light from an irradiation surface, connection wiring that electrically connects the laser driver and the semiconductor laser to each other with a wiring inductance of 0.5 nanohenries or less, a first optical element provided on the irradiation surface side of the semiconductor laser, and a second optical element provided outside the first optical element on the irradiation surface side of the semiconductor laser. This leads to an effect of electrically connecting the laser driver and the semiconductor laser to each other with a wiring inductance of 0.5 nanohenries or less and emitting the irradiation light via the first and second optical elements.

In addition, in the first aspect, the first optical element may be an optical element that makes the irradiation light from the semiconductor laser into parallel light, and the second optical element may be a diffractive optical element that diffracts the parallel light. This leads to an effect of performing spot irradiation via the first and second optical elements. In this case, the first optical element may be a collimator lens or a microlens array.

In addition, in the first aspect, the semiconductor lasers may be first and second semiconductor lasers, the first optical element may be an optical element that allows irradiation light from the first semiconductor laser to pass therethrough and that makes irradiation light from the second semiconductor laser into parallel light, and the second optical elements may be a diffusion element that refracts light having passed through the first optical element and a diffractive optical element that diffracts the parallel light from the first optical element. This leads to an effect of performing uniform irradiation and spot irradiation via the first and second optical elements.

In addition, in the first aspect, it is desirable that the connection wiring have a length of 0.5 millimeters or less. In addition, it is more preferable that the connection wiring be 0.3 millimeters or less.

In addition, in the first aspect, the connection wiring may be provided via a connection via provided in the substrate. This leads to an effect of shortening the wiring length.

In addition, in the first aspect, the semiconductor laser may be arranged in such a manner that a part thereof overlaps an upper part of the laser driver. In this case, the semiconductor laser may be arranged in such a manner that a part corresponding to 50% or less of the area thereof overlaps the upper part of the laser driver.

In addition, a second aspect of the present technique is to provide a manufacturing method of a semiconductor laser driving apparatus, the method including a step of forming a laser driver on an upper surface of a support plate, a step of forming a substrate incorporating the laser driver, by forming connection wiring of the laser driver, a step of mounting a semiconductor laser on one surface of the substrate and forming connection wiring that electrically connects the laser driver and the semiconductor laser to each other via the connection wiring with a wiring inductance of 0.5 nanohenries or less, a step of forming a first optical element on the irradiation surface side of the semiconductor laser, and a step of forming a second optical element outside the first optical element on the irradiation surface side of the semiconductor laser. This leads to an effect of electrically connecting the laser driver and the semiconductor laser to each other with a wiring inductance of 0.5 nanohenries or less and manufacturing a semiconductor laser driving apparatus that emits the irradiation light via the first and second optical elements.

BRIEF DESCRIPTION OF DRAWINGS

FIG. 1 is a diagram for illustrating a configuration example of a distance measurement module 19 according to an embodiment of the present technique.

FIG. 2 is a diagram for illustrating an example of a cross-sectional view of the distance measurement module 19 according to the embodiment of the present technique.

FIG. 3 is a diagram for illustrating an example of a top view of a light emitting unit 11 according to the embodiment of the present technique.

FIG. 6 depicts diagrams for illustrating the definition of an amount of overlap between a laser driver 200 and a semiconductor laser 300 according to the embodiment of the present technique.

FIG. 7 is a diagram for illustrating a numerical example of a wiring inductance with respect to a wiring length L and a wiring width W in the case where a wiring pattern is formed by an additive method.

FIG. 8 is a diagram for illustrating a numerical example of the wiring inductance with respect to the wiring length L and the wiring width W in the case where a wiring pattern is formed by a subtractive method.

FIG. 9 depicts first diagrams each illustrating an example of a process of processing a copper land and copper redistribution layer (RDL) in a manufacturing process of the laser driver 200 according to the embodiment of the present technique.

FIG. 11 depicts first diagrams each illustrating an example of a manufacturing process of a substrate 100 according to the embodiment of the present technique.

DESCRIPTION OF EMBODIMENTS

Figure 4:
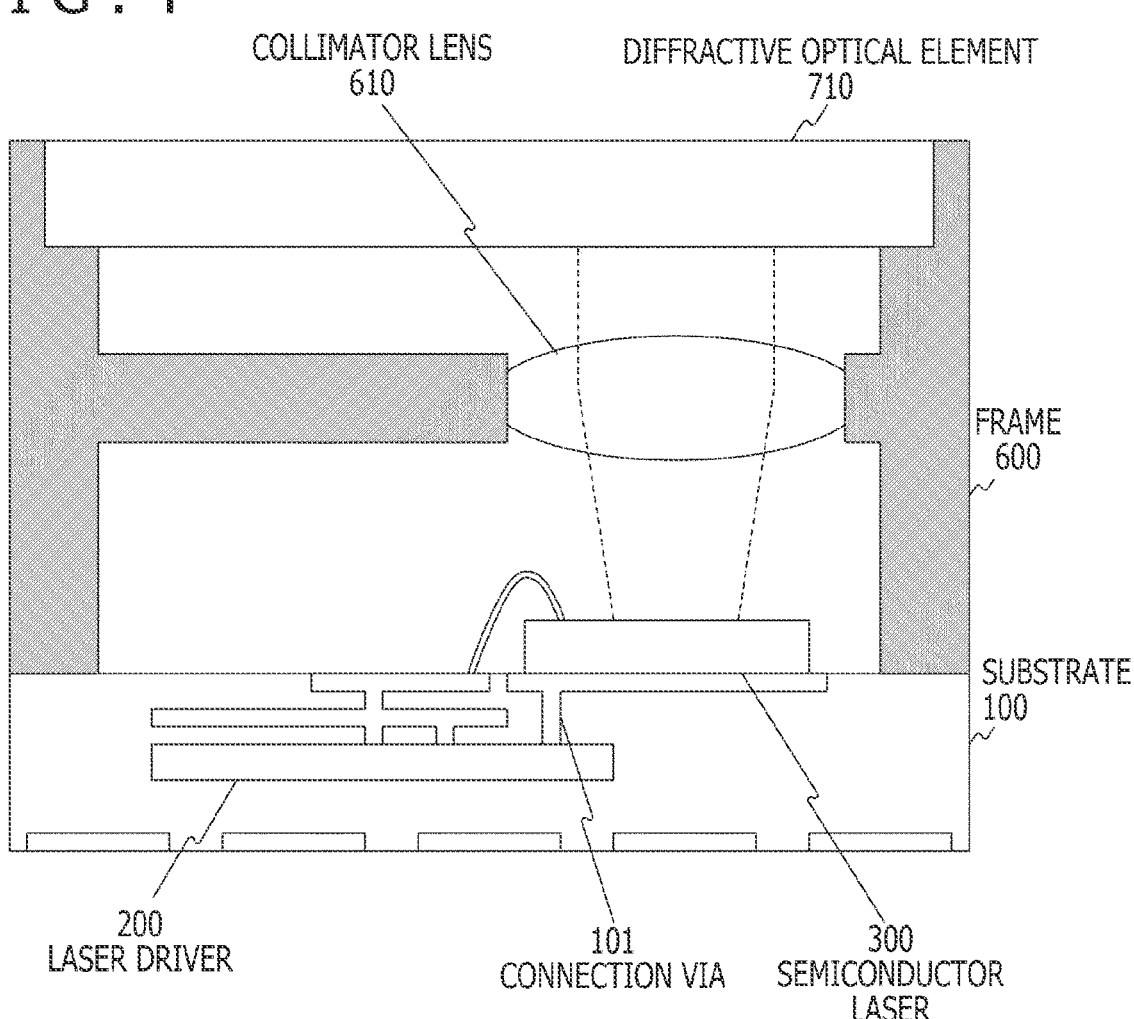
FIG. 4 is a diagram for illustrating an example of a cross-sectional view of a light emitting unit 11 according to a first embodiment of the present technique.

Hereinafter, modes for carrying out the present technique (hereinafter, referred to as embodiments) will be described. The explanation will be given in the following order.
1. First embodiment (example of performing spot irradiation)
2. Second embodiment (example of performing uniform irradiation and spot irradiation)
3. Modification example

1. First Embodiment

[Configuration of Distance Measurement Module]

FIG. 1 is a diagram for illustrating a configuration example of a distance measurement module 19 according to an embodiment of the present technique.

The distance measurement module 19 measures a distance by a ToF method, and includes a light emitting unit 11, a light receiving unit 12, a light emitting control unit 13, and a distance measurement computing unit 14. It should be noted that the distance measurement module 19 is an example of the semiconductor laser driving apparatus described in the claims.

The light emitting unit 11 emits irradiation light whose brightness periodically fluctuates and irradiates an object 20 with the irradiation light. The light emitting unit 11 generates the irradiation light in synchronization with, for example, a light emitting control signal CLKp of a rectangular wave. In addition, for example, a laser or a light emitting diode is used as the light emitting unit 11, and infrared light, near-infrared light, or the like having a wavelength in the range of 780 to 1000 nm is used as the irradiation light. It should be noted that the light emitting control signal CLKp is not limited to the rectangular wave as long as it is a periodic signal. For example, the light emitting control signal CLKp may be a sine wave.

The light emitting control unit 13 controls the irradiation timing of the irradiation light. The light emitting control unit 13 generates the light emitting control signal CLKp and supplies the same to the light emitting unit 11 and the light receiving unit 12. In addition, the light emitting control signal CLKp may be generated by the light receiving unit 12, and in this case, the light emitting control signal CLKp generated by the light receiving unit 12 is amplified by the light emitting control unit 13 and supplied to the light emitting unit 11. The frequency of the light emitting control signal CLKp is, for example, 100 megahertz (MHz). It should be noted that the frequency of the light emitting control signal CLKp is not limited to 100 MHz, and may be 200 MHz or the like. In addition, the light emitting control signal CLKp may be a single-ended signal or a differential signal.

The light receiving unit 12 receives reflected light reflected from the object 20, and detects, every time the period of a vertical synchronization signal elapses, the amount of light received within the period. For example, a periodic signal of 60 Hz is used as the vertical synchronization signal. In addition, a plurality of pixel circuits is arranged in a two-dimensional lattice shape in the light receiving unit 12. The light receiving unit 12 supplies image data (frame) including pixel data corresponding to the amount of light received by these pixel circuits to the distance measurement computing unit 14. It should be noted that the frequency of the vertical synchronization signal is not limited to 60 Hz, and may be, for example, 30 or 120 Hz.

The distance measurement computing unit 14 measures a distance to the object 20 on the basis of the image data by using the ToF method. The distance measurement computing unit 14 measures the distance for each pixel circuit and generates, for each pixel, a depth map indicating the distance to the object 20 by a gradation value. The depth map is used in, for example, image processing for performing blurring processing of a degree corresponding to the distance, AF (Auto Focus) processing for obtaining the focus of a focus lens on the basis of the distance, and the like. In addition, the depth map is expected to be used for gesture recognition, object recognition, obstacle detection, augmented reality (AR), virtual reality (VR), and the like.

It should be noted that, although an example of the distance measurement module for measuring a distance has been described here, the present technique can be applied to a sensing module in general.

FIG. 2 is a diagram for illustrating an example of a cross-sectional view of the distance measurement module 19 according to the embodiment of the present technique.

In this example, an interposer 30 as a relay part for a mother board 50 is provided on the mother board 50, and the light emitting unit 11 and the light receiving unit 12 are mounted on the interposer 30. A connector 40 is mounted on the interposer 30 and connected to an external application processor and the like.

The light receiving unit 12 includes a lens 22 and a sensor 21 for receiving reflected light reflected from the object 20.

[Configuration of Light Emitting Unit]

FIG. 3 is a diagram for illustrating an example of a top view of the light emitting unit 11 according to the embodiment of the present technique.

The light emitting unit 11 assumes measurement of a distance by ToF. ToF is high in depth accuracy although not as high as the structured light, and has such a characteristic that it can operate in a dark environment without any problem. In addition, ToF is considered to have many advantages as compared with other systems such as the structured light and the stereo camera in terms of the simplicity of the apparatus configuration and cost.

In the light emitting unit 11, a semiconductor laser 300, a photodiode 400, and a passive component 500 are electrically connected by surface solder mounting or wire bonding and mounted on the surface of a substrate 100 incorporating a laser driver 200. As the substrate 100, a printed wiring board is assumed.

The semiconductor laser 300 is a semiconductor device that emits laser light by allowing a current to flow through a PN junction of a compound semiconductor. Specifically, a vertical cavity surface emitting laser (VCSEL) is assumed. However, the semiconductor laser may be either a rear-surface light-emission type or a front-surface light-emission type. Here, as the compound semiconductor to be used, for example, aluminum gallium arsenide (AlGaAs), indium gallium arsenide phosphorus (InGaAsP), aluminum gallium indium phosphorus (AlGaInP), gallium nitride (GaN), and the like are assumed. The semiconductor laser 300 has a plurality of light emitting points and emits a spot laser from each light emitting point.

The laser driver 200 is a driver integrated circuit (IC) for driving the semiconductor laser 300. The laser driver 200 is incorporated in the substrate 100 in a face-up state. Regarding the electrical connection between the laser driver 200 and the semiconductor laser 300, since the wiring inductance needs to be reduced, it is desirable to make the wiring length as short as possible. This specific value will be described later.

The photodiode 400 is a diode for detecting light. The photodiode 400 is used for APC (Automatic Power Control) for maintaining the output of the semiconductor laser 300 constant, by detecting reflected light from an optical part (such as a diffraction element) that is arranged between the semiconductor laser and the distance measurement target and monitoring the light intensity of the semiconductor laser 300. This makes it possible to secure operation in a range that satisfies the safety standard of the laser.

The passive component 500 is a circuit component other than active elements such as a capacitor and a resistor. The passive component 500 includes a decoupling capacitor for driving the semiconductor laser 300.

FIG. 4 is a diagram for illustrating an example of a cross-sectional view of the light emitting unit 11 according to the first embodiment of the present technique.

As described above, the substrate 100 incorporates the laser driver 200, and the semiconductor laser 300 and the like are mounted on the surface thereof. The connection between the semiconductor laser 300 and the laser driver 200 on the substrate 100 is made via a connection via 101. The wiring length can be shortened by use of the connection via 101. It should be noted that the connection via 101 is an example of the connection wiring described in the claims.

In addition, the semiconductor laser 300, the photodiode 400, and the passive component 500 mounted on the surface of the substrate 100 are surrounded by a frame 600. As a material of the frame 600, for example, a plastic material or metal is assumed.

A collimator lens 610 is provided on the laser irradiation surface side of the semiconductor laser 300. Further, a diffractive optical element 710 is provided outside the collimator lens 610. The collimator lens 610 and the diffractive optical element 710 are supported by a frame 600.

The collimator lens 610 is an optical element that makes irradiation light emitted from the irradiation surface of the semiconductor laser 300 into parallel light. As a material of the collimator lens 610, for example, glass, resin, or the like is assumed. It should be noted that the collimator lens 610 is an example of the first optical element described in the claims.

The diffractive optical element (DOE) 710 is an optical element that diffracts the parallel light from the collimator lens 610. In the diffractive optical element 710, a desired diffraction angle can be obtained by adjusting the pitch of a lattice-like repeating structure with respect to the wavelength of a laser that has entered as the parallel light. It should be noted that the diffractive optical element 710 is an example of the second optical element described in the claims.

It should be noted that the parallel light entering the diffractive optical element 710 can be tilted by tilting the optical axis of the collimator lens 610 to the left direction from the center of the light emitting region of the semiconductor laser 300 in this example. In this case, since the parallel light region incident on the diffractive optical element 710 shifts to the left, a margin at the end (on the frame 600 side) of the diffractive optical element 710 can be omitted, and the size of the entire light emitting unit 11 can be reduced.

Figure 5:
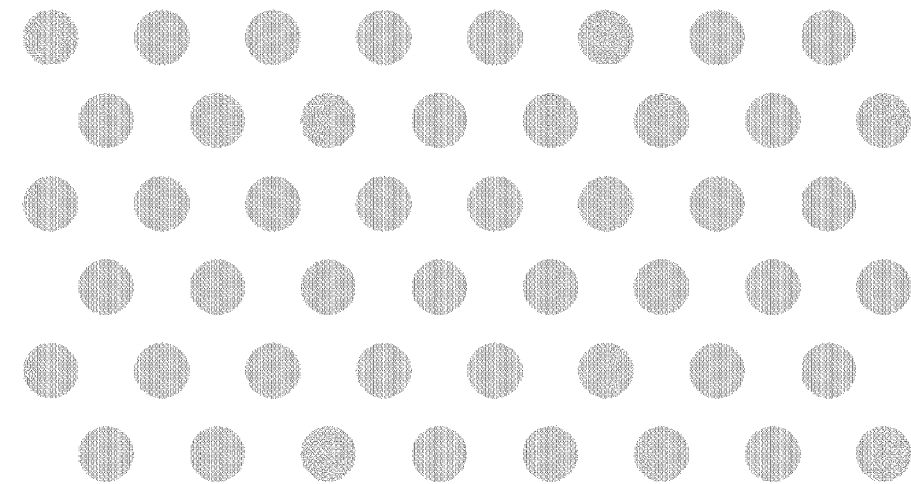
FIG. 5 is a diagram for illustrating an example of an illumination profile obtained by the light emitting unit 11 according to the first embodiment of the present technique.

FIG. 5 is a diagram for illustrating an example of an illumination profile obtained by the light emitting unit 11 according to the first embodiment of the present technique.

In this example, as illustrated in FIG. 5, spot irradiation of a dot pattern is performed by the diffractive optical element 710, so that the irradiation power per dot can be increased as compared with uniform beam irradiation. Accordingly, the reflected power from the object is increased, and the intensity of light obtained by the sensor 21 of the light receiving unit 12 is also increased. As a result, the SN ratio (Signal-Noise ratio) can be improved.

FIG. 6 depicts diagrams each illustrating the definition of an amount of overlap between the laser driver 200 and the semiconductor laser 300 according to the embodiment of the present technique.

As described above, since the connection between the semiconductor laser 300 and the laser driver 200 is assumed to be made via the connection via 101, the semiconductor laser 300 and the laser driver 200 are arranged while being overlapped one on another when viewed from the upper surface. On the other hand, it is desirable to provide a thermal via 102 on the lower surface of the semiconductor laser 300, and it is also necessary to secure a region therefor. Accordingly, in order to clarify the positional relation between the laser driver 200 and the semiconductor laser 300, the amount of overlap between the two is defined as follows.

In the arrangement illustrated in a of FIG. 6, there is no overlap region between the two when viewed from the upper surface. The overlap amount in this case is defined as 0%. On the other hand, in the arrangement illustrated in c of FIG. 6, the entire semiconductor laser 300 overlaps the laser driver 200 when viewed from the upper surface. The overlap amount in this case is defined as 100%.

Then, in the arrangement illustrated in b of FIG. 6, the half region of the semiconductor laser 300 overlaps the laser driver 200 when viewed from the upper surface. The overlap amount in this case is defined as 50%.

In the embodiment, the overlap amount is desirably larger than 0% to provide a region for the above-described connection via 101. On the other hand, when considering that a certain number of thermal vias 102 are to be arranged directly under the semiconductor laser 300, the overlap amount is desirably 50% or less. Thus, by making the overlap amount larger than 0% but 50% or less, the wiring inductance is reduced, and excellent heat radiation characteristics can be obtained.

[Wiring Inductance]

As described above, the wiring inductance becomes a problem in the connection between the semiconductor laser 300 and the laser driver 200. All conductors have an inductive component, and even an inductance of an extremely short lead wire may cause adverse effects in high frequency regions such as a ToF system. That is, when a high frequency operation is performed, the driving waveform for driving the semiconductor laser 300 from the laser driver 200 is distorted due to the influence of the wiring inductance, and the operation may become unstable.

Here, a theoretical equation for calculating the wiring inductance is examined. For example, the inductance IDC [μH] of a straight lead wire having a circular cross section with a length L [mm] and a radius R [mm] is represented in free space by the following equation. Note that ln represents the natural logarithm.

$$IDC=0.0002L\cdot(\ln(2L/R)-0.75)$$

In addition, for example, the inductance IDC [μH] of a strip line (substrate wiring pattern) having a length L [mm], a width W [mm], and a thickness H [mm] is represented in free space by the following equation.

$$IDC=0.0002L\cdot(\ln(2L/(W+H))+0.2235((W+H)/L)+0.5)$$

FIG. 7 and FIG. 8 illustrate the preliminary calculation of the wiring inductance [nH] between the laser driver incorporated inside the printed wiring board and the semiconductor laser electrically connected to an upper portion of the printed wiring board.

FIG. 7 is a diagram for illustrating a numerical example of a wiring inductance with respect to a wiring length L and a wiring width W in the case where a wiring pattern is formed by an additive method. The additive method is a method of forming a pattern by depositing copper only on a necessary part of an insulating resin surface.

FIG. 8 is a diagram for illustrating a numerical example of the wiring inductance with respect to the wiring length L and the wiring width W in the case where a wiring pattern is formed by a subtractive method. The subtractive is a method of forming a pattern by etching an unnecessary part of a copper-clad laminate.

In the case of a distance measurement module such as a ToF system, when assuming to drive at several hundred megahertz, the wiring inductance is desirably 0.5 nH or less, and more preferably 0.3 nH or less. Thus, when considering the above-described preliminary calculation result, it is considered that the wiring length between the semiconductor laser 300 and the laser driver 200 is desirably 0.5 millimeters or less, and more preferably 0.3 millimeters or less.

[Manufacturing Method]

Figure 10:
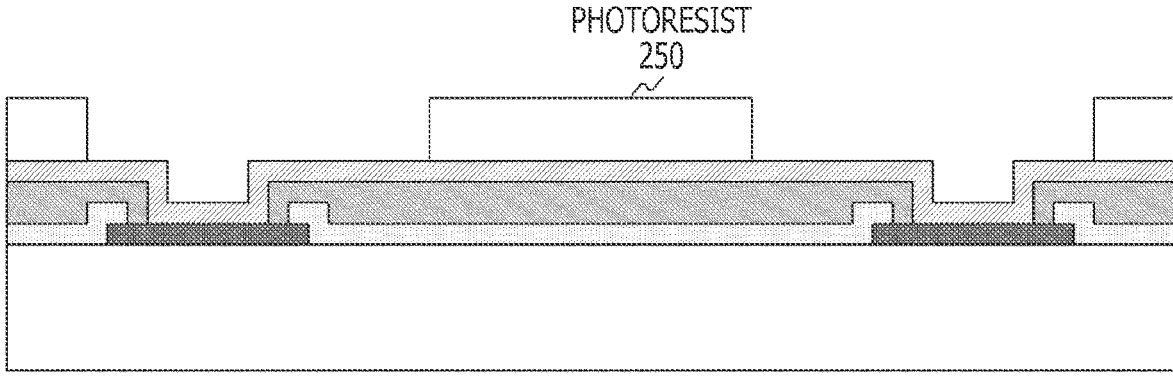
FIG. 10 depicts second diagrams each illustrating an example of a process of processing the copper land and copper redistribution layer (RDL) in the manufacturing process of the laser driver 200 according to the embodiment of the present technique.
Figure 10:
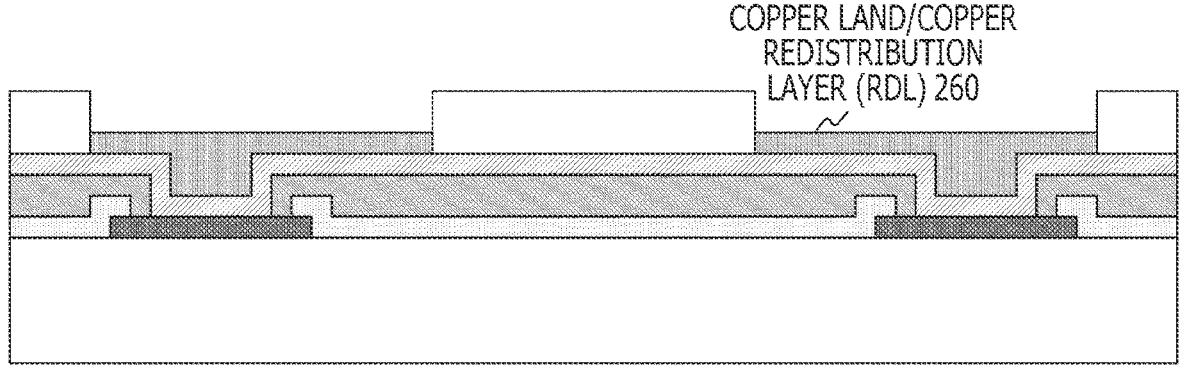
Figure 10:
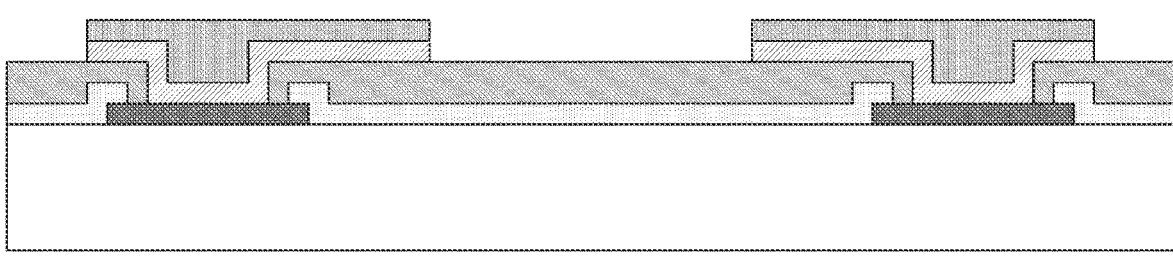

FIG. 9 and FIG. 10 are diagrams each illustrating an example of a process of processing a copper land and copper redistribution layer (RDL) in a manufacturing process of the laser driver 200 of the embodiment of the present technique.

First, as illustrated in a of FIG. 9, an I/O pad 210 made of, for example, aluminum or the like is formed on a semiconductor wafer. Then, a protective insulating layer 220 such as SiN is deposited on the surface, and a region of the I/O pad 210 is opened.

Next, as illustrated in b of FIG. 9, a surface protective film 230 made of polyimide (PI) or polybenzoxazole (PBO) is deposited, and a region of the I/O pad 210 is opened.

Then, as illustrated in c of FIG. 9, titanium tungsten (TiW) of approximately several tens to hundreds nm and copper (Cu) of approximately 100 to 1000 nm are sequentially sputtered to form an adhesion layer and seed layer 240. Here, in addition to titanium tungsten (TiW), a refractory metal such as chromium (Cr), nickel (Ni), titanium (Ti), titanium copper (TiCu), or platinum (Pt), or an alloy thereof may be applied to the adhesion layer. Further, in addition to copper (Cu), nickel (Ni), silver (Ag), gold (Au), or an alloy thereof may be applied to the seed layer.

Subsequently, as illustrated in d of FIG. 10, a photoresist 250 is patterned in order to form a copper land and copper redistribution layer for electrical bonding. Specifically, the copper land and copper redistribution layer for electrical bonding is formed by each of processes of surface cleaning, resist coating, drying, exposure, and development.

Then, as illustrated in e of FIG. 10, a copper land and copper redistribution layer (RDL) 260 for electrical bonding is formed on the adhesion layer and seed layer 240 by a plating method. Here, as the plating method, for example, an electrolytic copper plating method, an electrolytic nickel plating method, or the like can be used. In addition, it is desirable that the diameter of the copper land be approximately 50 to 100 micrometers, the thickness of the copper redistribution layer be approximately 3 to 10 micrometers, and the minimum width of the copper redistribution layer be approximately 10 micrometers.

Next, as illustrated in f of FIG. 10, the photoresist 250 is removed, and the copper land and copper redistribution layer (RDL) 260 of the semiconductor chip is masked and dry-etched. Here, as the dry etching, for example, ion milling for applying an argon ion beam can be used. An unnecessary region of the adhesion layer and seed layer 240 can be selectively removed by the dry etching, and the copper land and copper redistribution layers are separated from each other. It should be noted that the unnecessary region can be removed by wet etching using an aqueous solution of aqua regia, cerium (TV) nitrate ammonium, or potassium hydroxide, but is desirably removed by dry etching in consideration of side etching and thickness reduction of metal layers configuring the copper land and copper redistribution layer.

FIG. 11 to FIG. 15 are diagrams each illustrating an example of a manufacturing process of the substrate 100 according to the embodiment of the present technique.

First, as illustrated in a of FIG. 11, a peelable copper foil 130 having a two-layer structure of an ultra-thin copper foil 132 and a carrier copper foil 131 is thermocompression bonded to one surface of a support plate 110 via an adhesive resin layer 120 by roll laminating or laminating press.

As the support plate 110, a substrate made of an inorganic material, a metal material, a resin material, or the like can be used. For example, silicon (Si), glass, ceramic, copper, a copper-based alloy, aluminum, an aluminum alloy, stainless steel, a polyimide resin, or an epoxy resin can be used.

The carrier copper foil 131 having a thickness of 18 to 35 micrometers is vacuum-adhered to the ultra-thin copper foil 132 having a thickness of 2 to 5 micrometers, to be used as the peelable copper foil 130. As the peelable copper foil 130, for example, 3FD-P3/35 (made by Furukawa Circuit Foil Co., Ltd.), MT-18S5DH (made by MITSUI MINING & SMELTING CO., LTD.), or the like can be used.

As a resin material of the adhesive resin layer 120, an organic resin containing a reinforcing material of a glass fiber, such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, as the reinforcing material, an aramid nonwoven fabric, an aramid fiber, a polyester fiber, or the like can be used in addition to the glass fiber.

Next, as illustrated in b of FIG. 11, a plating base conductive layer (not illustrated) having a thickness of 0.5 to 3 micrometers is formed on the surface of the ultra-thin copper foil 132 of the peelable copper foil 130 by an electroless copper plating treatment. It should be noted that, in the electroless copper plating treatment, a conductive layer is formed as a base of electrolytic copper plating for forming a wiring pattern next. However, by omitting the electroless copper plating treatment, an electrode for electrolytic copper plating may be brought into direct contact with the peelable copper foil 130, and an electrolytic copper plating treatment may be directly applied on the peelable copper foil 130 to form a wiring pattern.

Then, as illustrated in c of FIG. 11, a photosensitive resist is pasted on the surface of the support plate by roll laminating, to form a resist pattern (solder resist 140) for a wiring pattern. As the photosensitive resist, for example, a plating resist of a dry film can be used.

Subsequently, as illustrated in d of FIG. 11, a wiring pattern 150 having a thickness of approximately 15 micrometers is formed by an electrolytic copper plating treatment.

Figure 12:
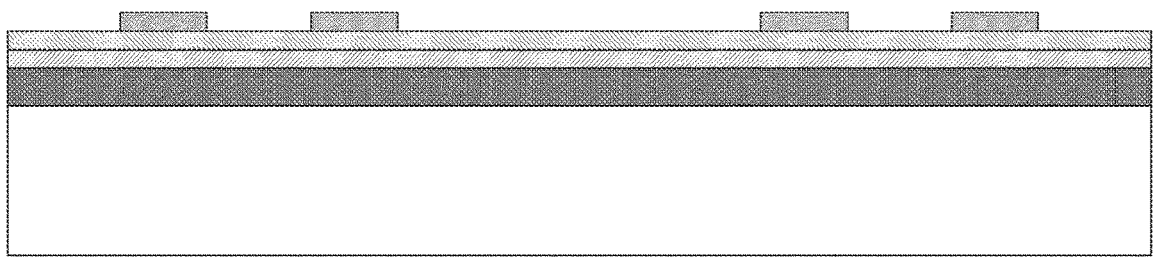
FIG. 12 depicts second diagrams each illustrating an example of the manufacturing process of the substrate 100 according to the embodiment of the present technique.
Figure 12:
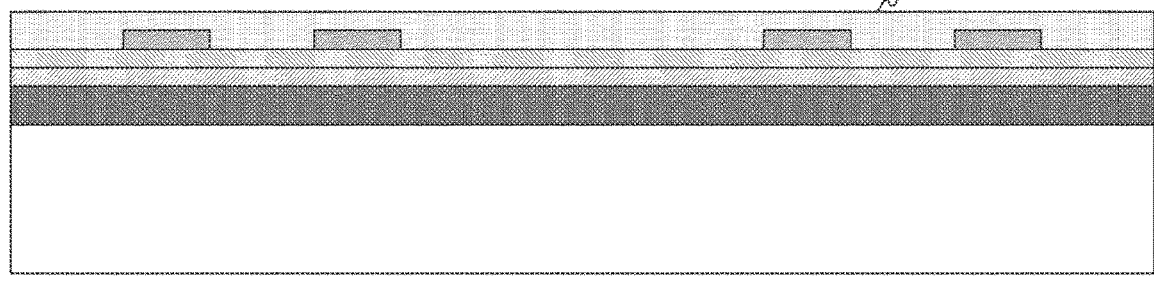
Figure 12:
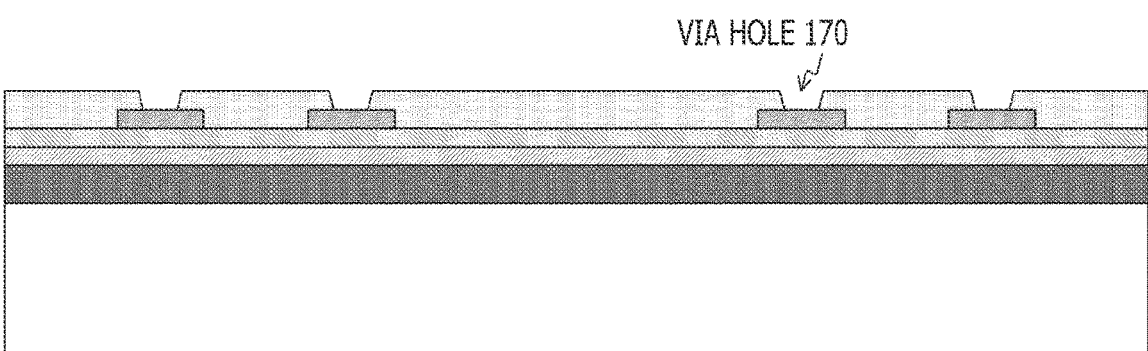

Then, as illustrated in e of FIG. 12, the plating resist is peeled off. Then, as a pretreatment for forming an interlayer insulating resin, the surface of the wiring pattern is roughened to improve the adhesion between the interlayer insulating resin and the wiring pattern. It should be noted that the roughening treatment can be performed by a blackening treatment by an oxidation/reduction treatment or a soft etching treatment using a sulfuric acid hydrogen peroxide mixture.

Next, as illustrated in f of FIG. 12, an interlayer insulating resin 161 is thermocompression bonded on the wiring pattern by roll laminating or laminating press. For example, an epoxy resin having a thickness of 45 micrometers is roll-laminated. In the case where a glass epoxy resin is used, copper foils having any thickness are superposed and thermocompression bonded by laminating press. As a resin material of the interlayer insulating resin 161, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, these resins alone or a combination of resins obtained by mixing a plurality of resins or preparing a compound can be used. Further, an interlayer insulating resin obtained by containing an inorganic filler in these materials or mixing a reinforcing material of a glass fiber can also be used.

Then, as illustrated in g of FIG. 12, a via hole for interlayer electrical connection is formed by a laser method or a photoetching method. In the case where the interlayer insulating resin 161 is a thermosetting resin, the via hole is formed by a laser method. As a laser beam, an ultraviolet laser such as a harmonic YAG laser or an excimer laser or an infrared laser such as a carbon dioxide gas laser can be used. It should be noted that, in the case where the via hole is formed by a laser beam, a desmear treatment is performed because a thin resin film may remain at the bottom of the via hole. In the desmear treatment, the resin is swollen by a strong alkali, and the resin is decomposed and removed by using an oxidizing agent such as chromic acid or a permanganate aqueous solution. In addition, the resin can also be removed by a plasma treatment or a sandblasting treatment by an abrasive material. In the case where the interlayer insulating resin 161 is a photosensitive resin, the via hole 170 is formed by a photoetching method. That is, the via hole 170 is formed by development after exposure using ultraviolet rays through a mask.

Next, after the roughening treatment, an electroless plating treatment is performed on the wall surface of the via hole 170 and the surface of the interlayer insulating resin 161. Then, a photosensitive resist is pasted by roll laminating on the surface of the interlayer insulating resin 161 subjected to the electroless plating treatment. As the photosensitive resist in this case, for example, a photosensitive plating resist film of a dry film can be used. The photosensitive plating resist film is exposed and then developed, so that a plating resist pattern with the portion of the via hole 170 and the portion of the wiring pattern being opened is formed. Subsequently, the opening portions of the plating resist pattern are subjected to a treatment of applying an electrolytic copper plating having a thickness of 15 micrometers. Then, the plating resist is peeled off, and the electroless plating remaining on the interlayer insulating resin is removed by flash etching using a sulfuric acid hydrogen peroxide mixture or the like, so that the via hole 170 filled with copper plating and the wiring pattern as illustrated in h of FIG. 12 are formed. Then, the similar steps of roughening the wiring pattern and forming the interlayer insulating resin 162 are repeated.

Subsequently, as illustrated in i of FIG. 13, the laser driver 200 with a die attach film (DAF) 290 obtained by processing the copper land and copper redistribution layer with a thickness reduced to approximately 30 to 50 micrometers is mounted in a face-up state.

Figure 13:
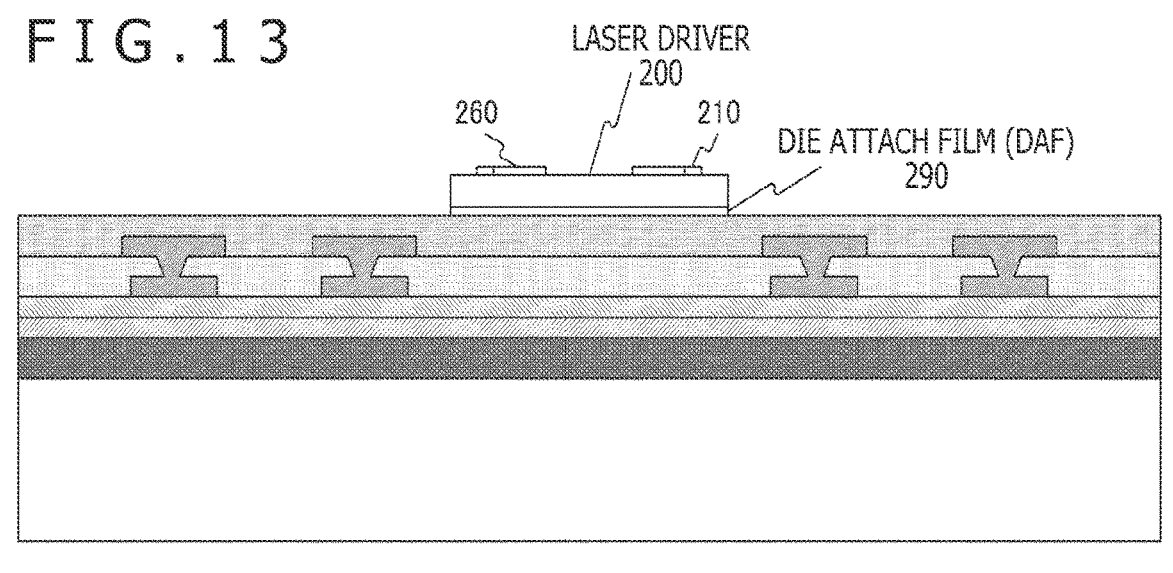
FIG. 13 depicts third diagrams each illustrating an example of the manufacturing process of the substrate 100 according to the embodiment of the present technique.
Figure 13:
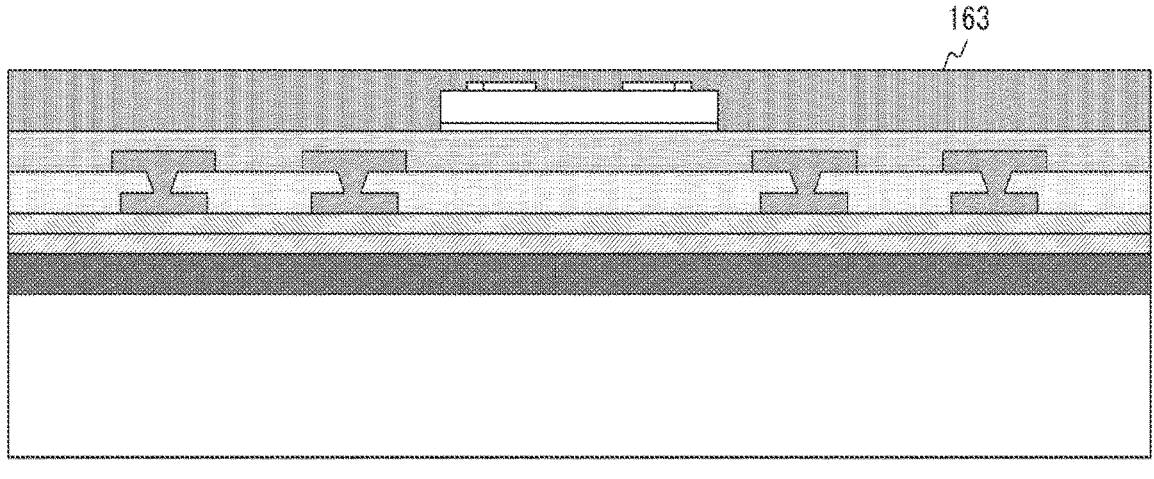
Figure 13:
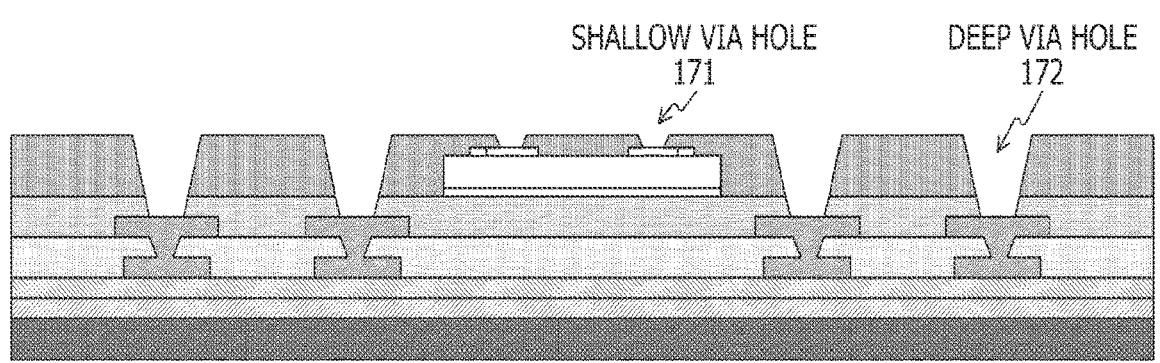

Then, as illustrated in j of FIG. 13, the interlayer insulating resin 163 is thermocompression bonded by roll laminating or laminating press.

Figure 14:
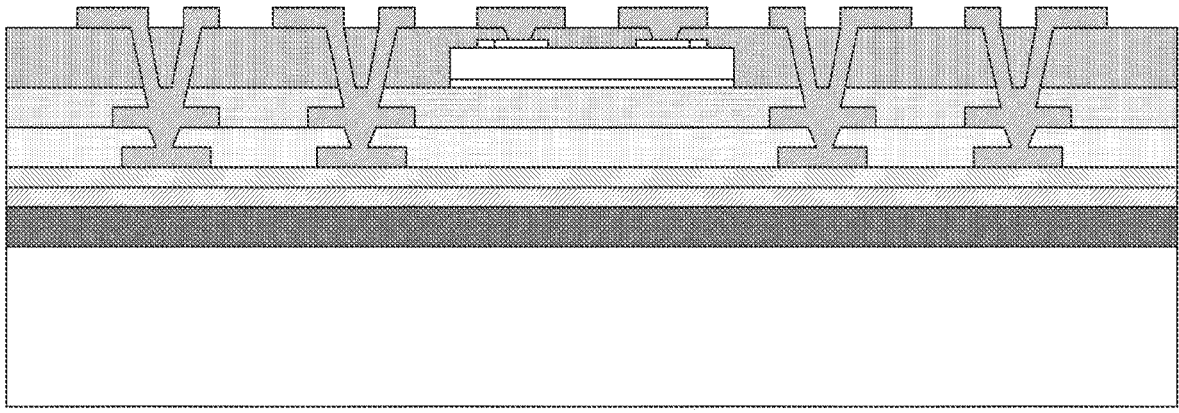
FIG. 14 depicts fourth diagrams each illustrating an example of the manufacturing process of the substrate 100 according to the embodiment of the present technique.
Figure 14:
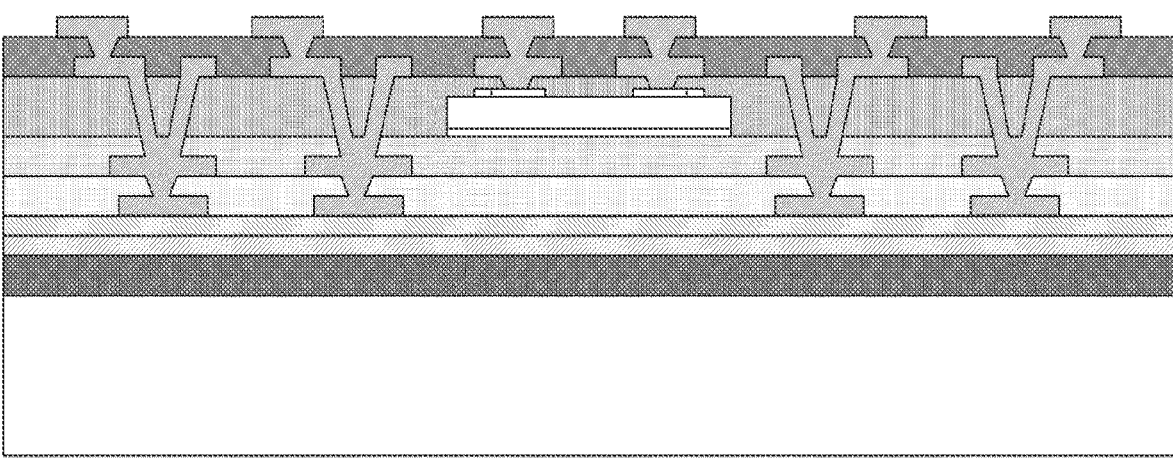
Figure 14:
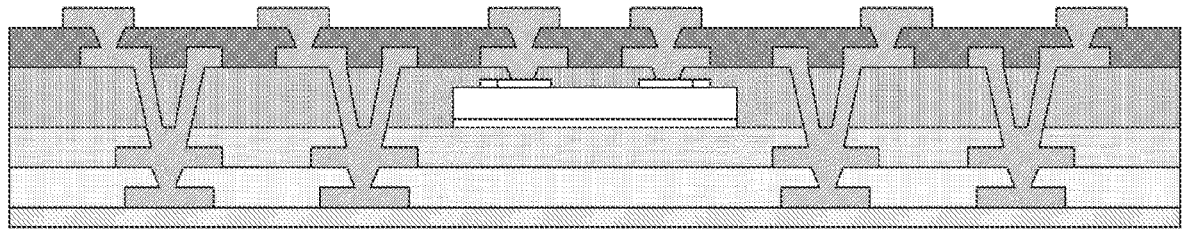

Next, as illustrated in k of FIG. 13 and l of FIG. 14, the via hole processing, the desmear treatment, the roughening treatment, the electroless plating treatment, and the electrolytic plating treatment similar to the above are performed. It should be noted that processing of a shallow via hole 171 for the copper land of the laser driver 200 and processing of a deep via hole 172 located one layer below, the desmear treatment, and the roughening treatment are performed simultaneously.

Here, the shallow via hole 171 is a filled via filled with copper plating. Each of the size and depth of the via is approximately 20 to 30 micrometers. In addition, the size of the diameter of the land is approximately 60 to 80 micrometers.

On the other hand, the deep via hole 172 is what is generally called a conformal via in which copper plating is applied only to the outside of the via. Each of the size and depth of the via is approximately 80 to 150 micrometers. In addition, the size of the diameter of the land is approximately 150 to 200 micrometers. It should be noted that it is desirable that the deep via hole 172 be arranged via an insulating resin of approximately 100 micrometers from the outer shape of the laser driver 200.

Next, as illustrated in m of FIG. 14, the interlayer insulating resin similar to the above is thermocompression bonded by roll laminating or laminating press. At this time, the inside of the conformal via is filled with the interlayer insulating resin. Then, the via hole processing, the desmear treatment, the roughening treatment, the electroless plating treatment, and the electrolytic plating treatment similar to the above are performed.

Subsequently, as illustrated in n of FIG. 14, the support plate 110 is separated by being peeled off from the interface between the carrier copper foil 131 and the ultra-thin copper foil 132 of the peelable copper foil 130.

Figure 15:
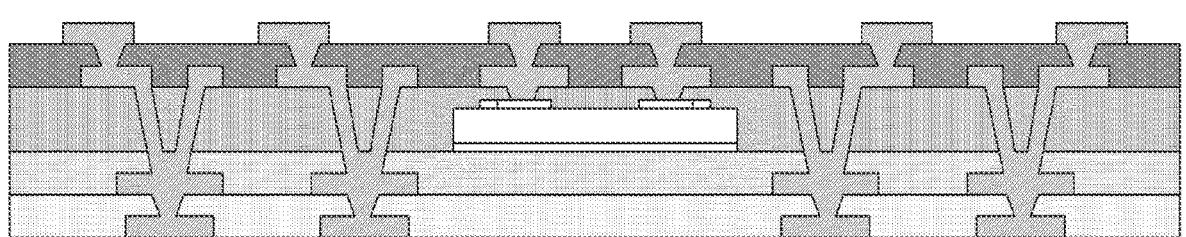
FIG. 15 depicts fifth diagrams each illustrating an example of the manufacturing process of the substrate 100 according to the embodiment of the present technique.
Figure 15:
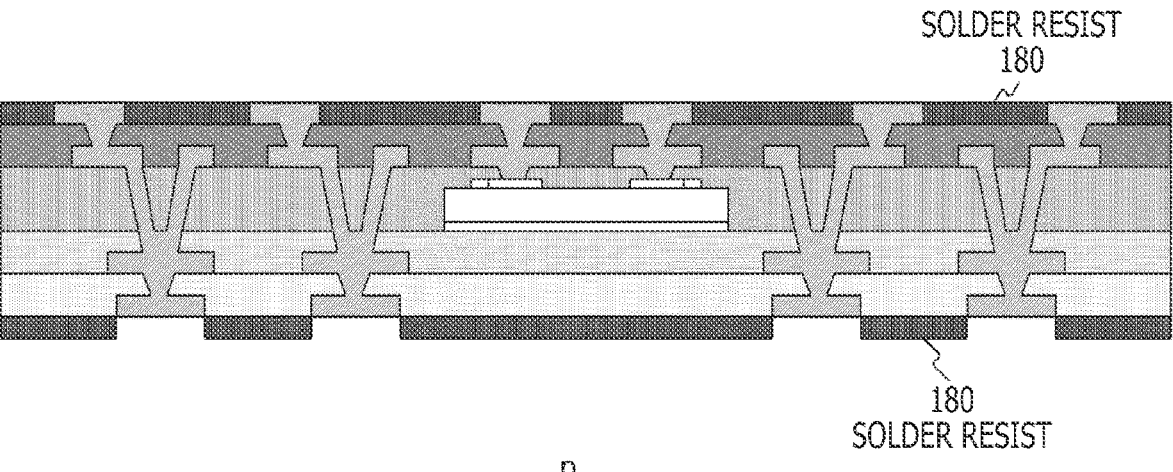

Then, as illustrated in o of FIG. 15, by removing the ultra-thin copper foil 132 and the plating base conductive layer with use of sulfuric acid-hydrogen peroxide-based soft etching, it is possible to obtain a component-incorporated substrate with the wiring pattern exposed.

Next, as illustrated in p of FIG. 15, a solder resist 180 of a pattern having an opening at the land portion of the wiring pattern is printed on the exposed wiring pattern. It should be noted that the solder resist 180 can be formed by a roll coater with use of a film type. Then, an electroless Ni plating of 3 micrometers or more is formed at the land portion of the opening of the solder resist 180, and an electroless Au plating of 0.03 micrometers or more is formed thereon. The electroless Au plating may be formed by one micrometer or more. Further, solder can be precoated thereon. Alternatively, an electrolytic Ni plating of 3 micrometers or more may be formed at the opening of the solder resist 180, and an electrolytic Au plating of 0.5 micrometers or more may be formed thereon. Further, other than the metal plating, an organic rust preventive film may be formed at the opening of the solder resist 180.

In addition, a BGA (Ball Grid Array) of solder balls may be mounted on the land for external connection by printing and applying cream solder as a connection terminal. In addition, as the connection terminal, a copper core ball, a copper pillar bump, a land grid array (LGA), or the like may be used.

The semiconductor laser 300, the photodiode 400, and the passive component 500 are mounted on the surface of the substrate 100 thus manufactured as described above, and the sidewall 600, the collimator lens 610, and the diffractive optical element 710 are attached thereto. In general, after performing the processing in the form of an aggregate substrate, the outer shape is processed by a dicer or the like to be separated into individual pieces.

It should be noted that, although the example of using the peelable copper foil 130 and the support plate 110 has been described in the above process, a copper clad laminate (CCL) can be used instead. In addition, as the manufacturing method of incorporating the component into the substrate, a method of forming a cavity in the substrate and mounting the same may be used.

As described above, according to the first embodiment of the present technique, the spot irradiation can be achieved while the wiring inductance between the semiconductor laser and the laser driver is reduced. That is, the irradiation light of the semiconductor laser 300 is made parallel by the collimator lens 610 and further diffracted by the diffractive optical element 710, so that the spot irradiation can be achieved. Accordingly, the irradiation power per dot is increased, and the SN ratio at the time of receiving light can be improved.

MODIFIED EXAMPLE

In the above-described first embodiment, the collimator lens 610 is used to make the irradiation light of the semiconductor laser 300 into parallel light, but other optical elements may be used.

Figure 16:
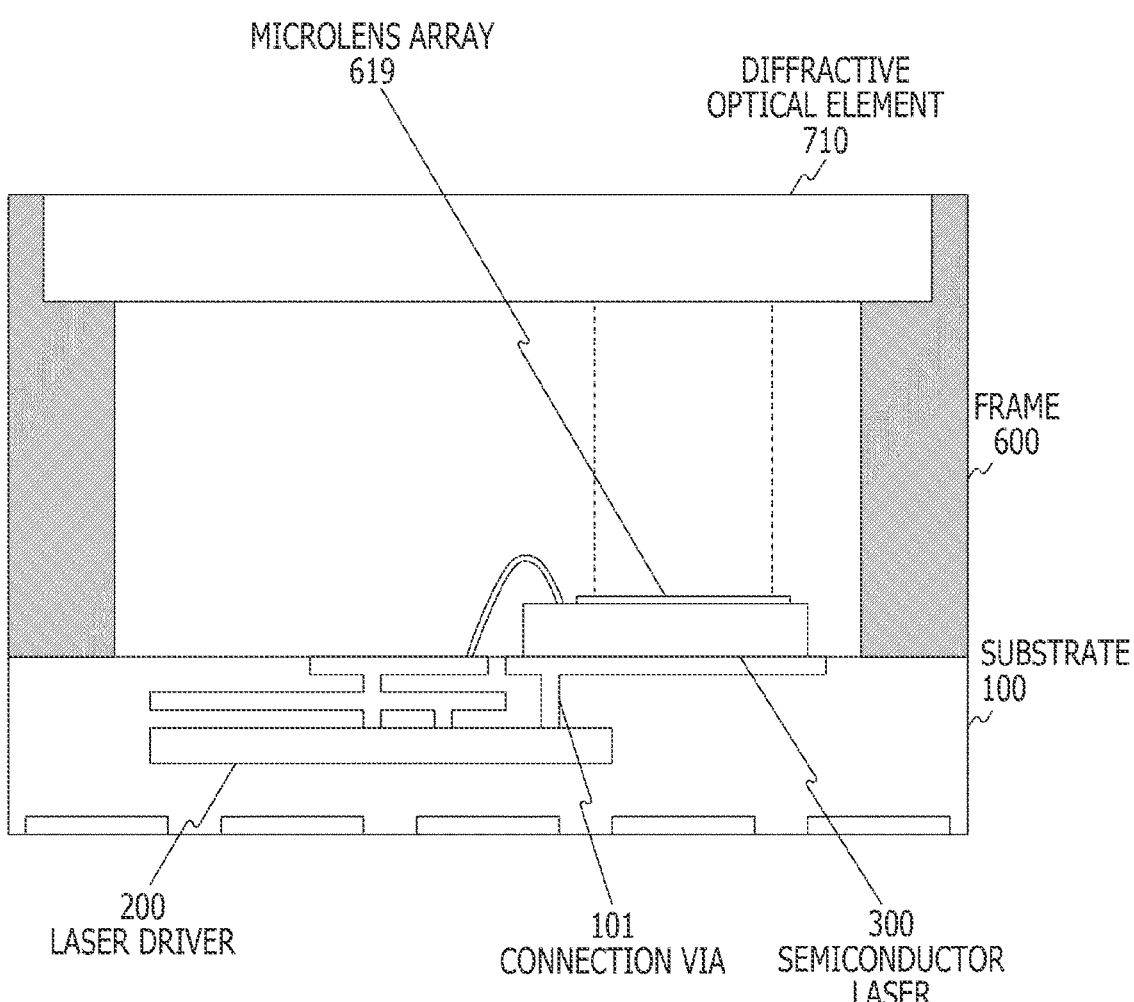
FIG. 16 is a diagram for illustrating an example of a cross-sectional view of a light emitting unit 11 according to a modified example of the first embodiment of the present technique.

FIG. 16 is a diagram for illustrating an example of a cross-sectional view of a light emitting unit 11 according to a modified example of the first embodiment of the present technique. In this modified example, a microlens array 619 is provided in place of the above-described collimator lens 610. The microlens array 619 is formed by arranging minute lenses in an array shape. The microlens array 619 is arranged directly on the irradiation surface of the semiconductor laser 300 or with a small gap between the microlens array 619 and the semiconductor laser 300.

Accordingly, parallel light can enter the diffractive optical element 710, and the spot irradiation can be achieved in the diffractive optical element 710, as in the above-described first embodiment. In addition, according to the modified example, the space between the semiconductor laser 300 and the microlens array 619 can be suppressed, and the height of the chip can be reduced.

2. Second Embodiment

Although one semiconductor laser 300 is assumed in the above-described first embodiment, an example in which a plurality of illumination profiles is provided with use of a plurality of semiconductor lasers will be described in a second embodiment.

Figure 17:
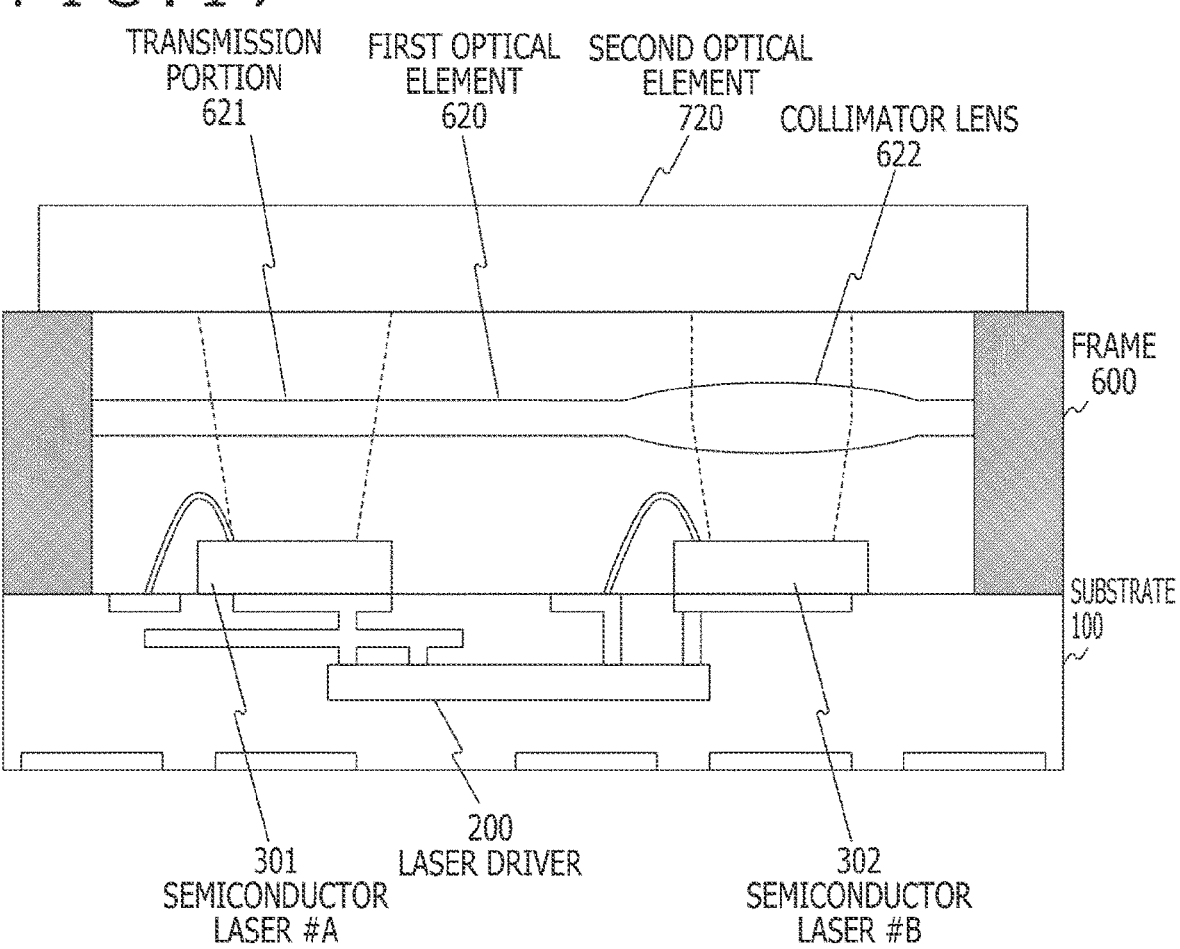
FIG. 17 is a diagram for illustrating an example of a cross-sectional view of a light emitting unit 11 according to a second embodiment of the present technique.

FIG. 17 is a diagram for illustrating an example of a cross-sectional view of a light emitting unit 11 according to the second embodiment of the present technique.

The light emitting unit 11 according to the second embodiment drives two semiconductor lasers #A (301) and #B (302) by a laser driver 200. In addition, a region #A for irradiation light from the semiconductor laser #A (301) is provided not with a collimator lens but with a transmission portion 621, and a region #B for irradiation light from the semiconductor laser #B (302) is provided with a collimator lens 622. Here, the transmission portion 621 and the collimator lens 622 can be formed integrally, and are collectively referred to as a first optical element 620. It should be noted that the first optical element 620 is an example of the first optical element described in the claims.

The first optical element 620 can be manufactured, for example, by forming a lens on a flat glass plate by using resin and curing the lens. In addition, the first optical element 620 can also be manufactured by press-forming resin like a mold.

In the first optical element 620, a column may be provided between the transmission portion 621 and the collimator lens 622. In addition, the transmission portion 621 may be hollow with no glass or the like being provided.

Accordingly, the irradiation light from the semiconductor laser #A (301) enters a second optical element 720 while spreading, and the irradiation light from the semiconductor laser #B (302) enters the second optical element 720 as parallel light.

Figure 18:
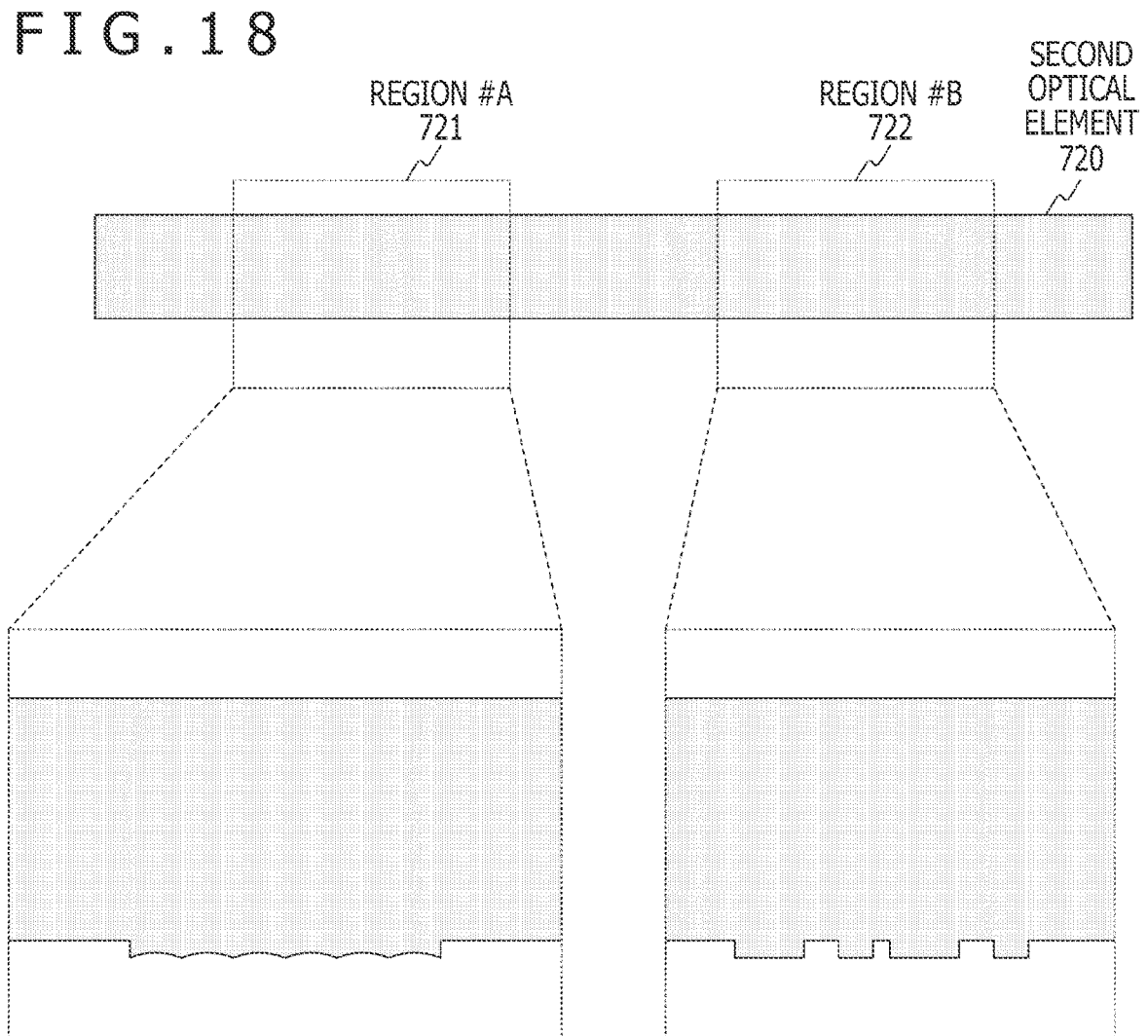
FIG. 18 is a diagram for illustrating an example of a cross-sectional view of a second optical element 720 according to the second embodiment of the present technique.

FIG. 18 is a diagram for illustrating an example of a cross-sectional view of the second optical element 720 according to the second embodiment of the present technique.

A concave microlens array having, for example, a pitch of several tens of micrometers and a depth of 10 to 30 micrometers is formed in the region #A (721) to which the irradiation light from the semiconductor laser #A (301) of the second optical element 720 is projected. Accordingly, the region #A (721) functions as a diffusion plate.

A binary diffraction element having, for example, a pitch of 10 micrometers and a depth of approximately 1 micrometer is formed in the region #B (722) to which the irradiation light from the semiconductor laser #B (302) of the second optical element 720 is projected. Accordingly, the region #B (722) functions as a diffraction element.

As described above, the second optical element 720 includes the region #A (721) and the region #B (722) that have different properties. It should be noted that the second optical element 720 is an example of the second optical element described in the claims.

Figure 19:
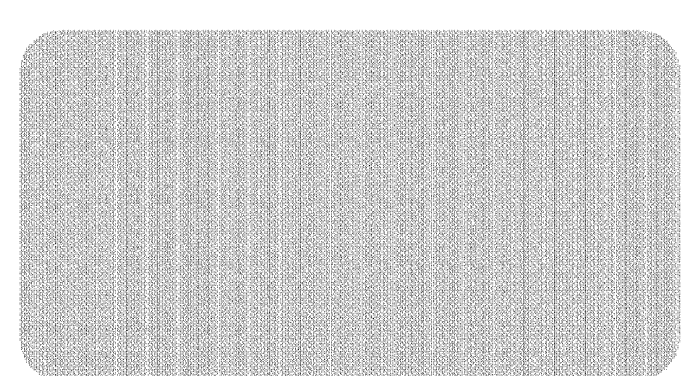
FIG. 19 depicts diagrams for illustrating an example of an illumination profile obtained by the light emitting unit 11 according to the second embodiment of the present technique.
Figure 19:
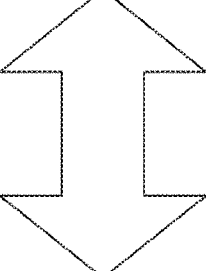
Figure 19:
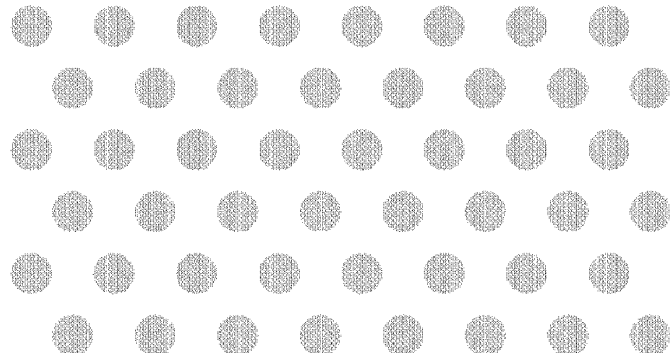

FIG. 19 depicts diagrams for illustrating an example of an illumination profile obtained by the light emitting unit 11 according to the second embodiment of the present technique.

As illustrated in a of FIG. 19, the irradiation light from the semiconductor laser #A (301) is diffused in the region #A (721) of the second optical element 720 to become uniform beam irradiation. Although the intensity of the beam is average in this case, high resolution can be obtained as compared with spot irradiation.

Meanwhile, as illustrated in b of FIG. 19, the irradiation light from the semiconductor laser #B (302) becomes parallel light by the collimator lens 622, is further diffracted in the region #B (722) of the second optical element 720, and becomes spot irradiation. In this case, the irradiation power per dot can be increased as compared with uniform beam irradiation, as in the above-described first embodiment.

That is, in the second embodiment, uniform beam irradiation and spot irradiation can be selectively used, according to applications such as resolution and the SN ratio.

As described above, according to the second embodiment of the present technique, providing different optical elements for a plurality of semiconductor lasers makes it possible to increase the number of illumination profiles and selectively use the illumination profile according to applications.

3. Application Example

[Electronic Equipment]

Figure 20:
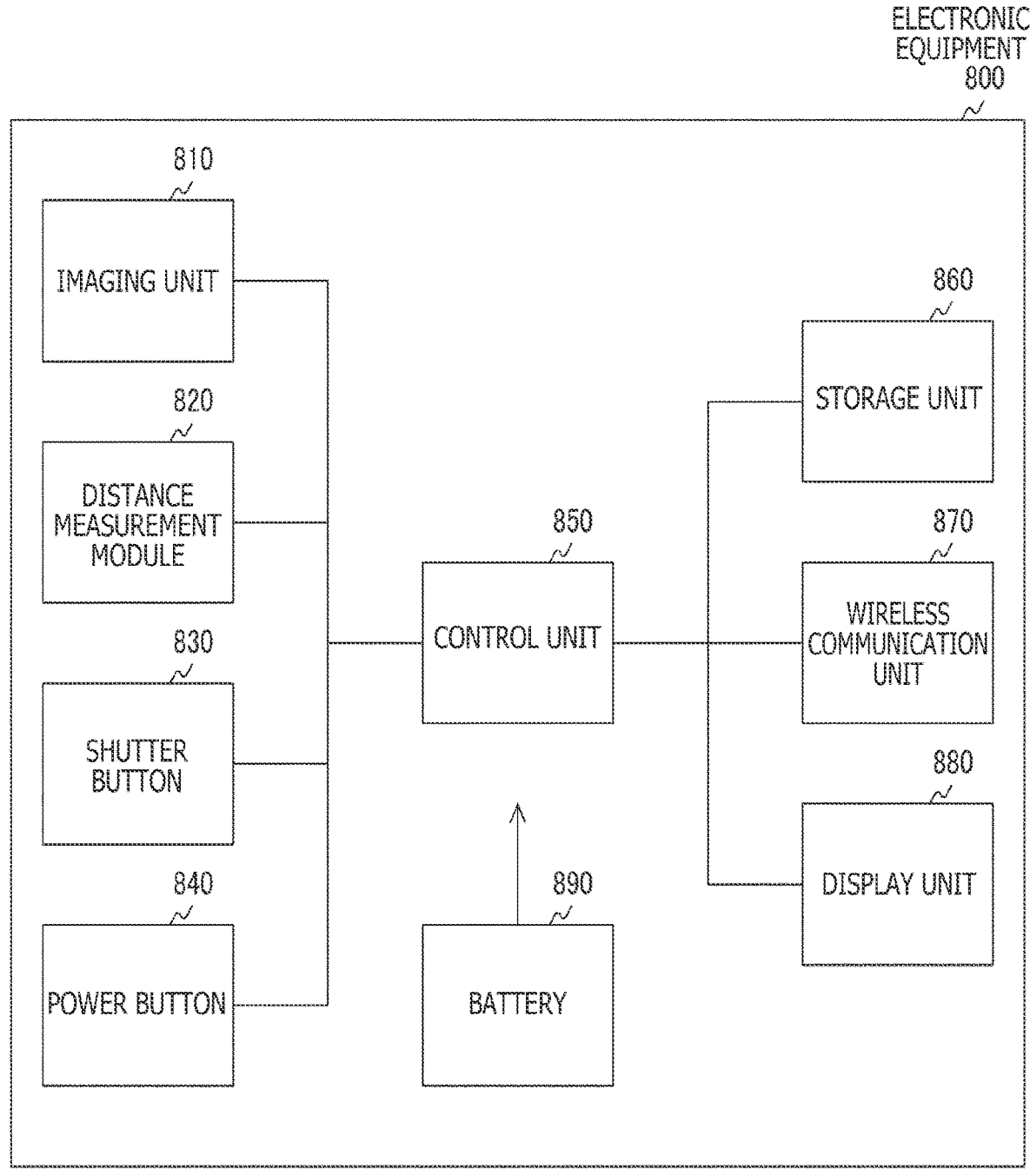
FIG. 20 is a diagram for illustrating a system configuration example of electronic equipment 800 as an application example of the embodiments of the present technique.

FIG. 20 is a diagram for illustrating a system configuration example of electronic equipment 800 as an application example of the embodiments of the present technique.

The electronic equipment 800 is a portable terminal in which the distance measurement module 19 according to the above-described embodiments is mounted. The electronic equipment 800 includes an imaging unit 810, a distance measurement module 820, a shutter button 830, a power button 840, a control unit 850, a storage unit 860, a radio communication unit 870, a display unit 880, and a battery 890.

The imaging unit 810 is an image sensor for imaging a subject. The distance measurement module 820 is the distance measurement module 19 according to the above-described embodiments.

The shutter button 830 is a button for giving an instruction on an imaging timing in the imaging unit 810 from the outside of the electronic equipment 800. The power button 840 is a button for giving an instruction on on/off of the power of the electronic equipment 800 from the outside of the electronic equipment 800.

The control unit 850 is a processing unit that controls the entire electronic equipment 800. The storage unit 860 is a memory for storing data and programs necessary for the operation of the electronic equipment 800. The wireless communication unit 870 performs wireless communication with the outside of the electronic equipment 800. The display unit 880 is a display for displaying an image or the like. The battery 890 is a power supply source for supplying power to each unit of the electronic equipment 800.

The imaging unit 810 detects the light receiving amount from 0 to 180 degrees as Q1 and detects the light receiving amount from 180 to 360 degrees as Q2 with a specific phase (for example, rising timing) of a light emission control signal for controlling the distance measurement module 820 defined as 0 degree. In addition, the imaging unit 810 detects the light receiving amount from 90 to 270 degrees as Q3 and detects the light receiving amount from 270 to 90 degrees as Q4. The control unit 850 computes a distance d to an object by the following equation on the basis of these light receiving amounts Q1 to Q4, and displays the distance d on the display unit 880.

$$d = (c/4\pi f) \times \arctan\{(Q3-Q4)/(Q1-Q2)\}$$

The unit of the distance d in the above equation is, for example, meters (m). In the equation, c is the speed of light, and the unit thereof is, for example, meters per second (m/s). In the equation, arctan is the inverse function of a tangent function. The value of "(Q3–Q4)/(Q1–Q2)" indicates a phase difference between the irradiated light and the reflected light. In the equation, n indicates the ratio of the circumference of a circle to its diameter. In addition, f is the frequency of the irradiated light, and the unit thereof is, for example, megahertz (MHz).

Figure 21:
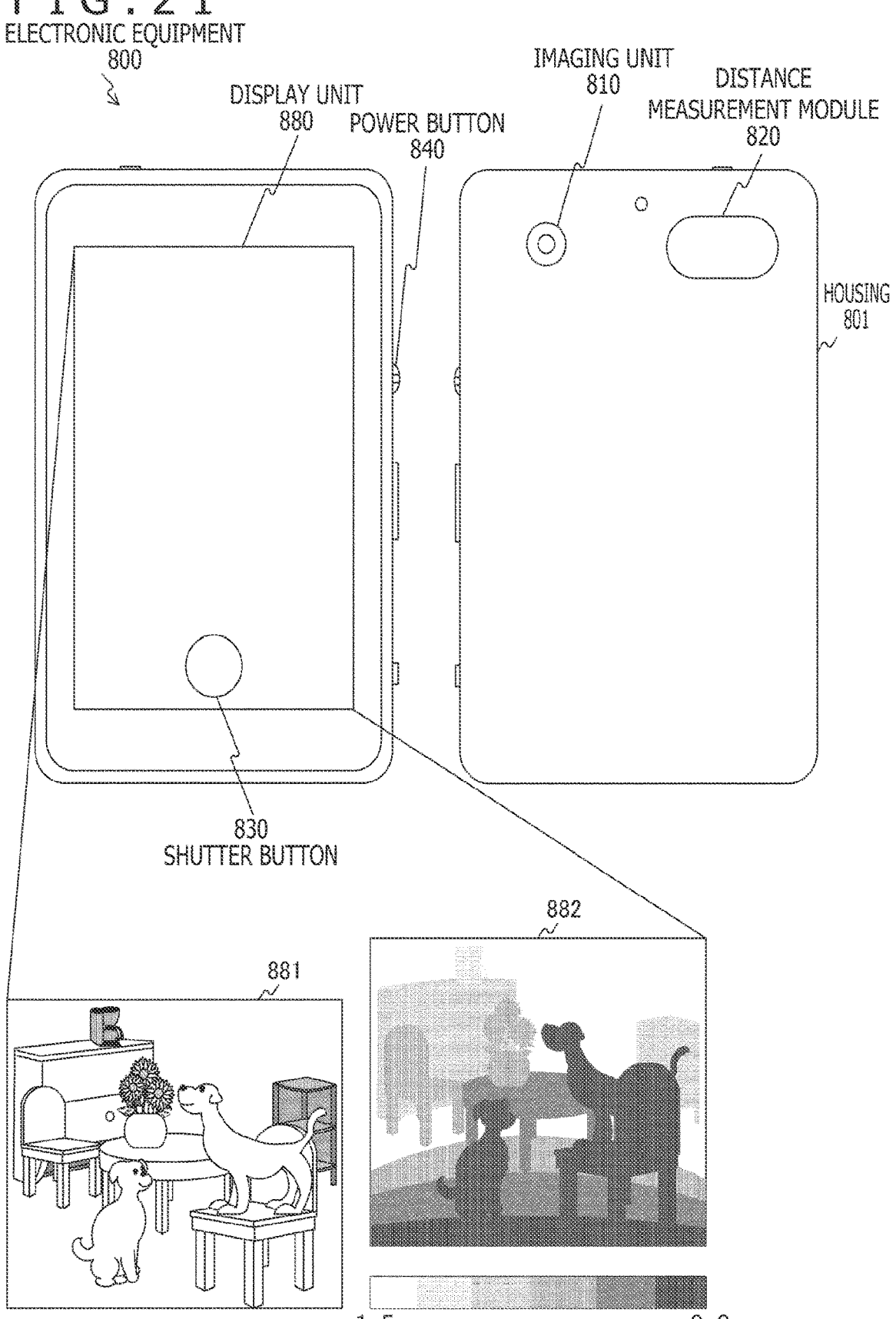
FIG. 21 is a diagram for illustrating an external configuration example of the electronic equipment 800 as an application example of the embodiments of the present technique.

FIG. 21 is a diagram for illustrating an external configuration example of the electronic equipment 800 as an application example of the embodiments of the present technique.

The electronic equipment 800 is housed in a housing 801, includes the power button 840 on a side surface, and includes the display unit 880 and the shutter button 830 on the front surface. In addition, optical regions of the imaging unit 810 and the distance measurement module 820 are provided on the rear surface.

Accordingly, the display unit 880 can display not only a normal captured image 881 but also a depth image 882 according to the distance measurement result using ToF.

It should be noted that, in the application example, a portable terminal such as a smartphone is exemplified as the electronic equipment 800, but the electronic equipment 800 is not limited thereto, and may be, for example, a digital camera, a game machine, wearable equipment, or the like.

It should be noted that the above-described embodiments illustrate an example for embodying the present technique, and the matters in the embodiments have corresponding relations with the matters specifying the invention in the claims. Similarly, the matters specifying the invention in the claims have corresponding relations with the matters in the embodiments of the present technique to which the same names are given. However, the present technique is not limited to the embodiments, and can be embodied by applying various modifications to the embodiments without departing from the gist thereof.

It should be noted that the effects described in the specification are merely illustrative and not limitative, and other effects may be provided.

It should be noted that the present technique can also be configured as follows.

(1) A semiconductor laser driving apparatus including:

a substrate incorporating a laser driver;

a semiconductor laser mounted on one surface of the substrate to emit irradiation light from an irradiation surface;

connection wiring that electrically connects the laser driver and the semiconductor laser to each other with a wiring inductance of 0.5 nanohenries or less;

a first optical element provided on the irradiation surface side of the semiconductor laser; and a second optical element provided outside the first optical element on the irradiation surface side of the semiconductor laser.

(2) The semiconductor laser driving apparatus according to (1), in which the first optical element is an optical element that makes irradiation light from the semiconductor laser into parallel light, and the second optical element is a diffractive optical element that diffracts the parallel light.

(3) The semiconductor laser driving apparatus according to (2), in which the first optical element is a collimator lens.

(4) The semiconductor laser driving apparatus according to (2), in which the first optical element is a microlens array.

(5) The semiconductor laser driving apparatus according to (1), in which the semiconductor laser includes first and second semiconductor lasers, the first optical element is an optical element that allows irradiation light from the first semiconductor laser to pass therethrough and that makes irradiation light from the second semiconductor laser into parallel light, and the second optical elements are a diffusion element that refracts light having passed through the first optical element and a diffractive optical element that diffracts the parallel light from the first optical element.

(6) The semiconductor laser driving apparatus according to any one of (1) to (5), in which the connection wiring has a length of 0.5 millimeters or less.

(7) The semiconductor laser driving apparatus according to any one of (1) to (6), in which the connection wiring is provided via a connection via provided in the substrate.

(8) The semiconductor laser driving apparatus according to any one of (1) to (7), in which the semiconductor laser is arranged in such a manner that a part thereof overlaps an upper part of the laser driver.

(9) The semiconductor laser driving apparatus according to (8), in which the semiconductor laser is arranged in such a manner that a part corresponding to 50% or less of an area thereof overlaps the upper part of the laser driver.

(10) Electronic equipment including:

a substrate incorporating a laser driver;

a semiconductor laser mounted on one surface of the substrate to emit irradiation light from an irradiation surface;

connection wiring that electrically connects the laser driver and the semiconductor laser to each other with a wiring inductance of 0.5 nanohenries or less;

a first optical element provided on the irradiation surface side of the semiconductor laser; and a second optical element provided outside the first optical element on the irradiation surface side of the semiconductor laser.

(11) A manufacturing method of a semiconductor laser driving apparatus, including:

a step of forming a laser driver on an upper surface of a support plate;

a step of forming a substrate incorporating the laser driver by forming connection wiring of the laser driver;

a step of mounting a semiconductor laser on one surface of the substrate and forming connection wiring that electrically connects the laser driver and the semiconductor laser to each other via the connection wiring with a wiring inductance of 0.5 nanohenries or less;

a step of forming a first optical element on the irradiation surface side of the semiconductor laser; and a step of forming a second optical element outside the first optical element on the irradiation surface side of the semiconductor laser.

REFERENCE SIGNS LIST

11: Light emitting unit
12: Light receiving unit

13: Light emitting control unit
14: Distance measurement computing unit
19: Distance measurement module
100: Substrate
101: Connection via
110: Support plate
120: Adhesive resin layer
130: Peelable copper foil
131: Carrier copper foil
132: Ultra-thin copper foil
140: Solder resist
150: Wiring pattern
161 to 163: Interlayer insulating resin
170 to 172: Via hole
180: Solder resist
200: Laser driver
210: I/O pad
220: Protective insulating layer
230: Surface protective film
240: Adhesion layer and seed layer
250: Photoresist
260: Copper land and copper redistribution layer (RDL)
290: Die attach film (DAF)
300: Semiconductor laser
301: Solder bump
302: Bonding wire
400: Photodiode
500: Passive component
600: Frame
610: Collimator lens
619: Microlens array
620: First optical element
622: Collimator lens
710: Diffractive optical element
720: Second optical element
800: Electronic equipment
801: Housing
810: Imaging unit
820: Distance measurement module
830: Shutter button
840: Power button
850: Control unit
860: Storage unit
870: Wireless communication unit
880: Display unit
890: Battery

What is claimed is:

1. A semiconductor laser driving apparatus, comprising:
a substrate incorporating a laser driver;
a first semiconductor laser mounted on one surface of the substrate to emit irradiation light from an irradiation surface;
a second semiconductor laser mounted on the one surface of the substrate to emit irradiation light from an irradiation surface;
connection wiring that electrically connects the laser driver and the first semiconductor laser to each other with a wiring inductance of 0.5 nanohenries or less and that electrically connects the laser driver and the second semiconductor laser to each other with a wiring inductance of 0.5 nanohenries or less;
a first optical element provided on an irradiation surface side of the first and second semiconductor lasers, wherein the first optical element includes a first region and a second region, wherein the first region of the first optical element is a transmission portion that allows irradiation light from the first semiconductor laser to pass therethrough, wherein the first region of the first optical element does not include a collimator lens, and wherein the second region of the first optical element includes a collimator lens that makes irradiation light from the second semiconductor laser into parallel light; and
a second optical element provided outside the first optical element on the irradiation surface side of the first and second semiconductor lasers.

2. The semiconductor laser driving apparatus according to claim 1,
wherein
the second optical element is a diffractive optical element that diffracts the parallel light.

3. The semiconductor laser driving apparatus according to claim 2,
wherein the first optical element includes a microlens array.

4. The semiconductor laser driving apparatus according to claim 1,
wherein the second optical element includes a diffusion element that refracts light having passed through the first region of the first optical element and a diffractive optical element that diffracts the parallel light from the second region of the first optical element, wherein the second optical element includes a diffusion element that refracts light output by the first semiconductor laser and that is received as spreading light from the first region of the first optical element, and wherein the second optical element includes a diffractive optical element that diffracts light output by the second semiconductor laser and that is received as parallel light from the second region of the first optical element.

5. The semiconductor laser driving apparatus according to claim 1,
wherein the connection wiring connecting the laser driver and the first semiconductor laser has a length of 0.5 millimeters or less.

6. The semiconductor laser driving apparatus according to claim 1,
wherein the connection wiring connecting the laser driver and the first semiconductor laser is provided via a connection via provided in the substrate.

7. The semiconductor laser driving apparatus according to claim 1,
wherein the first semiconductor laser is arranged in such a manner that a part thereof overlaps an upper part of the laser driver.

8. The semiconductor laser driving apparatus according to claim 7,
wherein the first semiconductor laser is arranged in such a manner that a part corresponding to 50% or less of an area thereof overlaps the upper part of the laser driver.

9. The semiconductor laser driving apparatus according to claim 1, wherein the second optical element includes a diffusion element that refracts light output by the first semiconductor laser that is received at the diffusion element as spreading light from the first region of the first optical element, and wherein the second optical element includes a diffraction element that diffracts light output by the second semiconductor laser that is received at the diffraction element as parallel light from the second region of the first optical element.

10. Electronic equipment, comprising:
a substrate incorporating a laser driver;

a first semiconductor laser mounted on one surface of the substrate to emit irradiation light from an irradiation surface;

a second semiconductor laser mounted on the one surface of the substrate to emit irradiation light from an irradiation surface;

connection wiring that electrically connects the laser driver and the first semiconductor laser to each other with a wiring inductance of 0.5 nanohenries or less and that electrically connects the laser driver and the second semiconductor laser to each other with a wiring inductance of 0.5 nanohenries or less;

a first optical element provided on an irradiation surface side of the first and second semiconductor lasers, wherein the first optical element includes a first region and a second region, wherein the first region of the first optical element is transmission portion that allows irradiation light from the first semiconductor laser to pass therethrough, wherein the first region of the first optical element does not include a collimator lens, and wherein the second region of the first optical element includes a collimator lens that makes irradiation light from the second semiconductor laser into parallel light; and a second optical element provided outside the first optical element on the irradiation surface side of the first and second semiconductor lasers.

11. A manufacturing method of a semiconductor laser driving apparatus, comprising:

a step of forming a laser driver on an upper surface of a support plate;

a step of forming a substrate incorporating the laser driver, by forming connection wiring of the laser driver;

a step of mounting a first semiconductor laser on one surface of the substrate and forming connection wiring that electrically connects the first laser driver and the semiconductor laser to each other via the connection wiring with a wiring inductance of 0.5 nanohenries or less;

a step of mounting a second semiconductor laser on one surface of the substrate and forming connection wiring that electrically connects the laser driver and the semiconductor laser to each other via the connection wiring with a wiring inductance of 0.5 nanohenries or less;

a step of forming a first optical element on an irradiation surface side of the first and second semiconductor lasers, wherein the first optical element includes a first region and a second region, wherein the first region of the first optical element is a transmission portion that allows irradiation light from the first semiconductor laser to pass therethrough, wherein the first region of the first optical element does not include a collimator lens, and wherein the second region of the first optical element includes a collimator lens that makes irradiation light from the second semiconductor laser into parallel light;

and a step of forming a second optical element outside the first optical element on the irradiation surface side of the first and second semiconductor lasers.

\* \* \* \* \*